United States Patent
Yamamoto et al.

(10) Patent No.: US 9,441,294 B2
(45) Date of Patent: Sep. 13, 2016

(54) SUBSTRATE PROCESSING APPARATUS, METHOD OF MANUFACTURING SEMICONDUCTOR DEVICE AND NON-TRANSITORY COMPUTER-READABLE RECORDING MEDIUM

(71) Applicant: Hitachi Kokusai Electric Inc., Tokyo (JP)

(72) Inventors: Katsuhiko Yamamoto, Toyama (JP); Yuki Taira, Toyama (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 0 days.

(21) Appl. No.: 14/636,927

(22) Filed: Mar. 3, 2015

(65) Prior Publication Data

US 2015/0325434 A1    Nov. 12, 2015

(30) Foreign Application Priority Data

May 6, 2014   (JP) ................................. 2014-043758
Feb. 4, 2015  (JP) ................................. 2015-020166

(51) Int. Cl.
*C23C 16/455*  (2006.01)
*H01L 21/02*   (2006.01)
(Continued)

(52) U.S. Cl.
CPC ......... *C23C 16/45551* (2013.01); *C23C 16/34* (2013.01); *C23C 16/45534* (2013.01); *C23C 16/45536* (2013.01); *H01J 37/3244* (2013.01); *H01J 37/32513* (2013.01);
(Continued)

(58) Field of Classification Search
CPC .................. H01L 21/02274; H01L 21/02123; H01L 21/02175; H01L 21/02252; H01L 21/02321; H01L 21/0234; H01L 21/28556; H01L 21/68

USPC ........................................................ 438/762
See application file for complete search history.

(56) References Cited

U.S. PATENT DOCUMENTS

2008/0193643 A1* 8/2008 Dip .................. C23C 16/45508
                                              427/255.5
2010/0260936 A1* 10/2010 Kato ................ H01L 21/67109
                                              427/255.28

(Continued)

FOREIGN PATENT DOCUMENTS

JP   2007-194239    8/2007
JP   2010-056477   12/2007

(Continued)

OTHER PUBLICATIONS

Office Action in corresponding Korean Patent Application No. 10-2015-0029067, mailed on May 31, 2016, with English Translation.

*Primary Examiner* — Karen Kusumakar
*Assistant Examiner* — Adam S Bowen
(74) *Attorney, Agent, or Firm* — Edell, Shapiro & Finnan LLC

(57) ABSTRACT

A high quality thin film is formed by forming a layer in which remaining residues are suppressed for each cycle. When a substrate sequentially passes through a first processing region, a second processing region, and a third processing region by rotating a substrate placement unit, a first layer is formed on the substrate while the substrate passes through the first processing region, a second layer is formed by reacting plasma of a reactive gas with the first layer while the substrate passes through the second processing region, and the second layer is modified by plasma of a modifying gas while the substrate passes through the third processing region.

18 Claims, 13 Drawing Sheets

(51) Int. Cl.
*H01L 21/68* (2006.01)
*H01L 21/285* (2006.01)
*H01L 21/31* (2006.01)
*C23C 16/34* (2006.01)
*H01J 37/32* (2006.01)

(52) U.S. Cl.
CPC .. *H01J 37/32633* (2013.01); *H01J 37/32733* (2013.01); *H01J 37/32899* (2013.01); *H01L 21/0234* (2013.01); *H01L 21/02123* (2013.01); *H01L 21/02175* (2013.01); *H01L 21/02252* (2013.01); *H01L 21/02274* (2013.01); *H01L 21/02321* (2013.01); *H01L 21/285* (2013.01); *H01L 21/28556* (2013.01); *H01L 21/31* (2013.01); *H01L 21/68* (2013.01)

(56) References Cited

U.S. PATENT DOCUMENTS

2013/0078823 A1* 3/2013 Takeshima ........ H01L 21/67109
438/799
2013/0206067 A1 8/2013 Kato et al.
2014/0024200 A1 1/2014 Kato et al.

FOREIGN PATENT DOCUMENTS

KR 10-2013-0092508 A 8/2013
KR 10-2014-0011989 A 1/2014

* cited by examiner

US 9,441,294 B2

SUBSTRATE PROCESSING APPARATUS, METHOD OF MANUFACTURING SEMICONDUCTOR DEVICE AND NON-TRANSITORY COMPUTER-READABLE RECORDING MEDIUM

CROSS REFERENCE TO RELATED APPLICATIONS

This application claims foreign priority under 35 U.S.C. §119(a)-(d) to Application No. JP 2014-020166 filed on Feb. 4, 2015 and Japanese Application No. JP 2014-043758 filed on May 6, 2016, the entire contents of which are hereby incorporated by reference.

FIELD OF THE INVENTION

The present invention relates to a substrate processing apparatus, a method of manufacturing a semiconductor device, and a non-transitory computer-readable recording medium.

BACKGROUND

As a method of forming a thin film that is used to manufacture a semiconductor device such as a flash memory or a dynamic random access memory (DRAM), a chemical vapor deposition (CVD) method has been known. The CVD method is a method in which a gas-phase reaction of a source gas and a reactive gas or a reaction at a surface of a substrate is used and a thin film having an element included in a molecule of the source gas as a component is deposited on the substrate.

Also, as a method of forming a thin film, there is a method of forming a thin film on the substrate by sequentially passing the substrate through a processing region in which the source gas is supplied and a processing region in which the reactive gas is supplied, instead of changing a gas atmosphere in a process chamber.

However, only passing through the processing region in which the source gas is supplied and the processing region in which the reactive gas is supplied, the reaction caused by the reactive gas is insufficient. Therefore, residues such as some components of the source gas may remain in the thin film formed on the substrate.

SUMMARY

The present invention provides a configuration capable of forming a high quality thin film by forming a thin film while remaining residues are suppressed.

According to an aspect of the present invention, there is provided a substrate processing apparatus including: a process chamber including a first processing region, a second processing region and a third processing region, and configured to process a substrate in the first processing region, the second processing region and the third processing region; a rotating mechanism configured to rotate a substrate placement unit supporting the substrate; a process gas supply system configured to supply a source gas, a reactive gas and a modifying gas to the first processing region, the second processing region and the third processing region, respectively; a reactive gas plasma generating unit configured to generate plasma of the reactive gas in the second processing region; a modifying gas plasma generating unit configured to generate plasma of the modifying gas in the third processing region; and a control unit configured to control the rotating mechanism, the process gas supply system, the reactive gas plasma generating unit and the modifying gas plasma generating unit to pass the substrate through the first processing region, the second processing region and the third processing region in sequence by rotating the substrate placement unit, to form a first layer on the substrate while the substrate passes through the first processing region and a second layer by reacting the first layer with the plasma of the reactive gas while the substrate passes through the second processing region, and to modify the second layer with the plasma of the modifying gas while the substrate passes through the third processing region.

DETAILED DESCRIPTION

First Embodiment of the Present Invention

Hereinafter, the first embodiment of the present invention will be described with reference to the accompanying drawings.

(1) Configuration of Substrate Processing Apparatus

First, a substrate processing apparatus 10 according to the present embodiment will be described with reference to FIGS. 1 and 2.

Also, in the substrate processing apparatus 10 to which the present invention is applied, as a carrier for transferring a wafer 200 serving as a substrate, a front opening unified pod (FOUP) 100 (hereinafter referred to as a "pod") is used. A transfer device of the cluster type substrate processing apparatus 10 according to the present embodiment is divided into a vacuum side and an atmosphere side.

Also, in the following description, front, rear, left and right are based on FIG. 1. A direction of X1 is defined as the right, a direction of X2 as the left, a direction of Y1 as the front, and a direction of Y2 as the rear in FIG. 1.

[Configuration of Vacuum Side]

Figure 1:
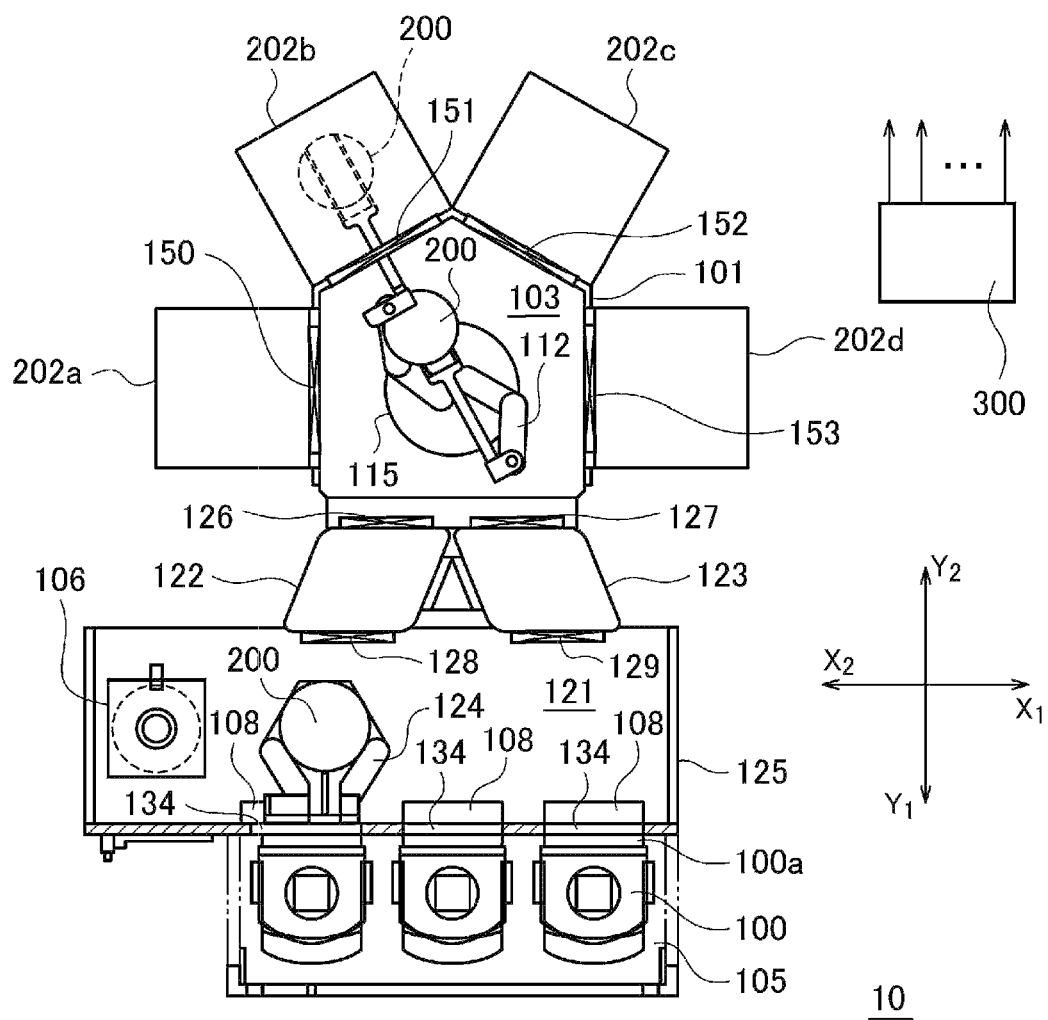
FIG. 1 is a cross-sectional schematic view of a cluster type substrate processing apparatus according to a first embodiment of the present invention.
Figure 2:
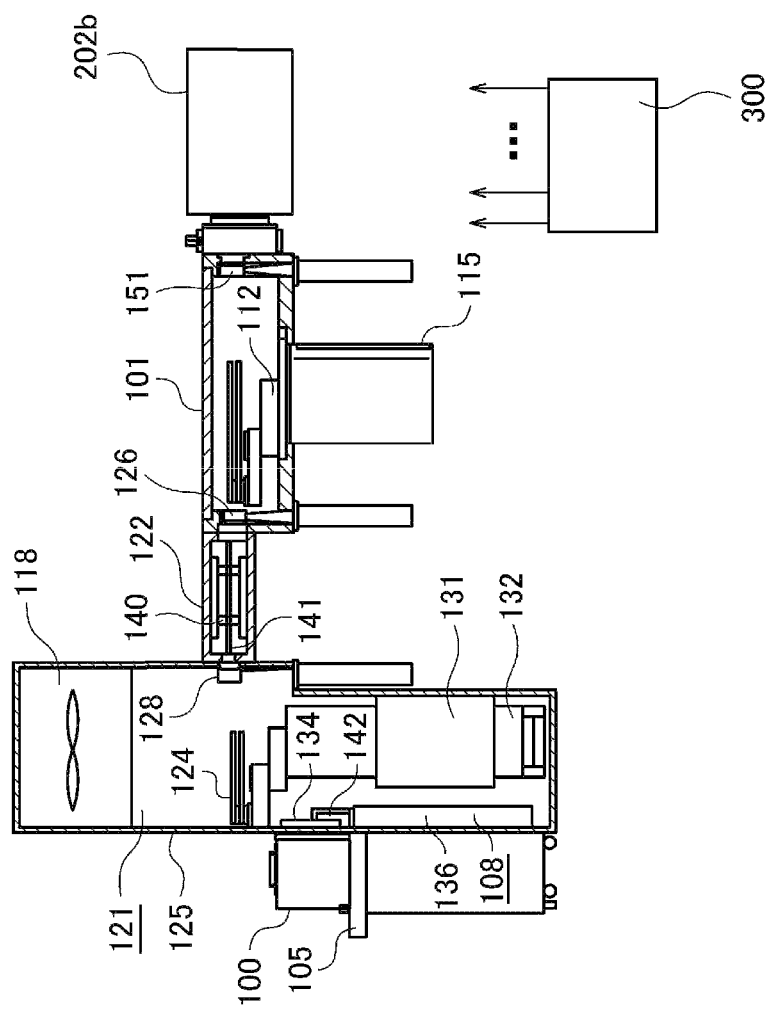
FIG. 2 is a vertical cross-sectional schematic view of the cluster type substrate processing apparatus according to the first embodiment of the present invention.

As illustrated in FIGS. 1 and 2, the substrate processing apparatus 10 includes a first transfer chamber 103 that can withstand a pressure [a negative pressure] below atmospheric pressure such as a vacuum state. A housing 101 of the first transfer chamber 103 has, for example, a pentagonal shape in a plan view, and is formed to have a box shape whose upper and lower ends are closed. Also, the term "plan view" used below refers to a birds-eye view of the substrate processing apparatus 10.

A first wafer transfer device 112 capable of simultaneously transferring the two wafers 200 under a negative pressure is provided in the first transfer chamber 103. The first wafer transfer device 112 is configured to maintain airtightness of the first transfer chamber 103 and perform lifting by a first wafer transfer device elevator 115.

Among five sidewalls of the housing 101, at a sidewall located in a front side, spare chambers 122 and 123 (load lock chambers) are connected through gate valves 126 and 127, respectively. The spare chambers 122 and 123 are configured to have functions of both loading the wafer 200 and unloading the wafer 200, and are configured to have a structure that can withstand a negative pressure.

Also, the two wafers 200 may be placed to be stacked in the spare chambers 122 and 123 by a substrate support 140. A partitioning plate (intermediate plate) 141 disposed between the wafers 200 is provided in the spare chambers 122 and 123.

Among the five sidewalls of the housing 101 of the first transfer chamber 103, a first process chamber 202a, a second process chamber 202b, a third process chamber 202c and a fourth process chamber 202d, which perform a desired process on the substrate, are adjacently connected to four sidewalls located at a rear side [a back side] through gate valves 150, 151, 152 and 153, respectively. The process chambers (such as the first process chamber 202a) will be described below in detail.

[Configuration of Atmosphere Side]

A second transfer chamber 121 capable of transferring the wafer 200 under a vacuum state and atmospheric pressure is connected to the front side of the spare chambers 122 and 123 through gate valves 128 and 129. A second wafer transfer device 124 configured to transfer the wafer 200 is provided in the second transfer chamber 121. The second wafer transfer device 124 is configured to be lifted by a second wafer transfer device elevator 131 provided in the second transfer chamber 121 and is configured to laterally reciprocate by a linear actuator 132.

A notch aligning device 106 is provided at a left side of the second transfer chamber 121. Also, the notch aligning device 106 may be an orientation flat aligning device. Also, a clean unit 118 configured to supply clean air is provided above the second transfer chamber 121.

At a front side of a housing 125 of the second transfer chamber 121, a substrate loading and unloading port 134 configured to load or unload the wafer 200 into or from the second transfer chamber 121 and a pod opener 108 are provided. At a side opposite to the pod opener 108, that is, at an outer side of the housing 125, a load port (IO stage) 105 is provided with the substrate loading and unloading port 134 therebetween. The pod opener 108 opens or closes a cap 100a of the pod 100, and includes a closure 142 capable of closing the substrate loading and unloading port 134 and a driving mechanism 136 configured to drive the closure 142. When the cap 100a of the pod 100 placed in the load port 105 is opened or closed, the wafer 200 may be loaded or unloaded into or from the pod 100. Also, the pod 100 is supplied or discharged to or from the load port 105 by an in-process transfer device (such as OHT) (not illustrated).

(2) Configuration of Process Chamber

Next, a configuration of a process chamber serving as a processing furnace according to the present embodiment will be generally described with reference to FIGS. 3 to 5. Also, the line A-A' is a polygonal line from A to A' through the center of a reaction container 203.

Here, the first process chamber 202a, the second process chamber 202b, the third process chamber 202c and the fourth process chamber 202d of the present embodiment may have, for example, the same configuration. Hereinafter, the first process chamber 202a, the second process chamber 202b, the third process chamber 202c and the fourth process chamber 202d are collectively called "a process chamber 202."

[Process Chamber]

Figure 3:
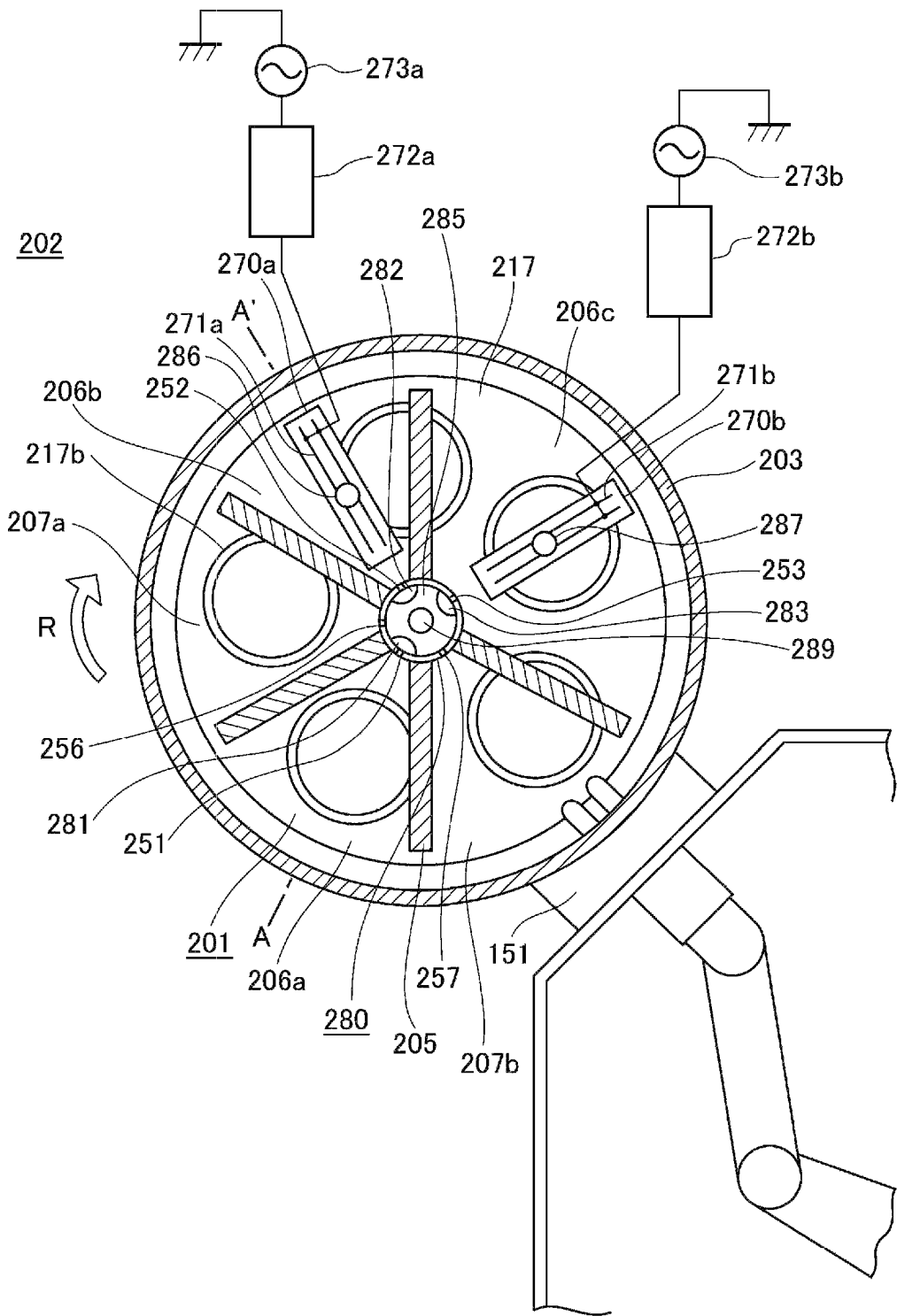
FIG. 3 is a cross-sectional schematic view of a process chamber included in the substrate processing apparatus according to the first embodiment of the present invention.
Figure 4:
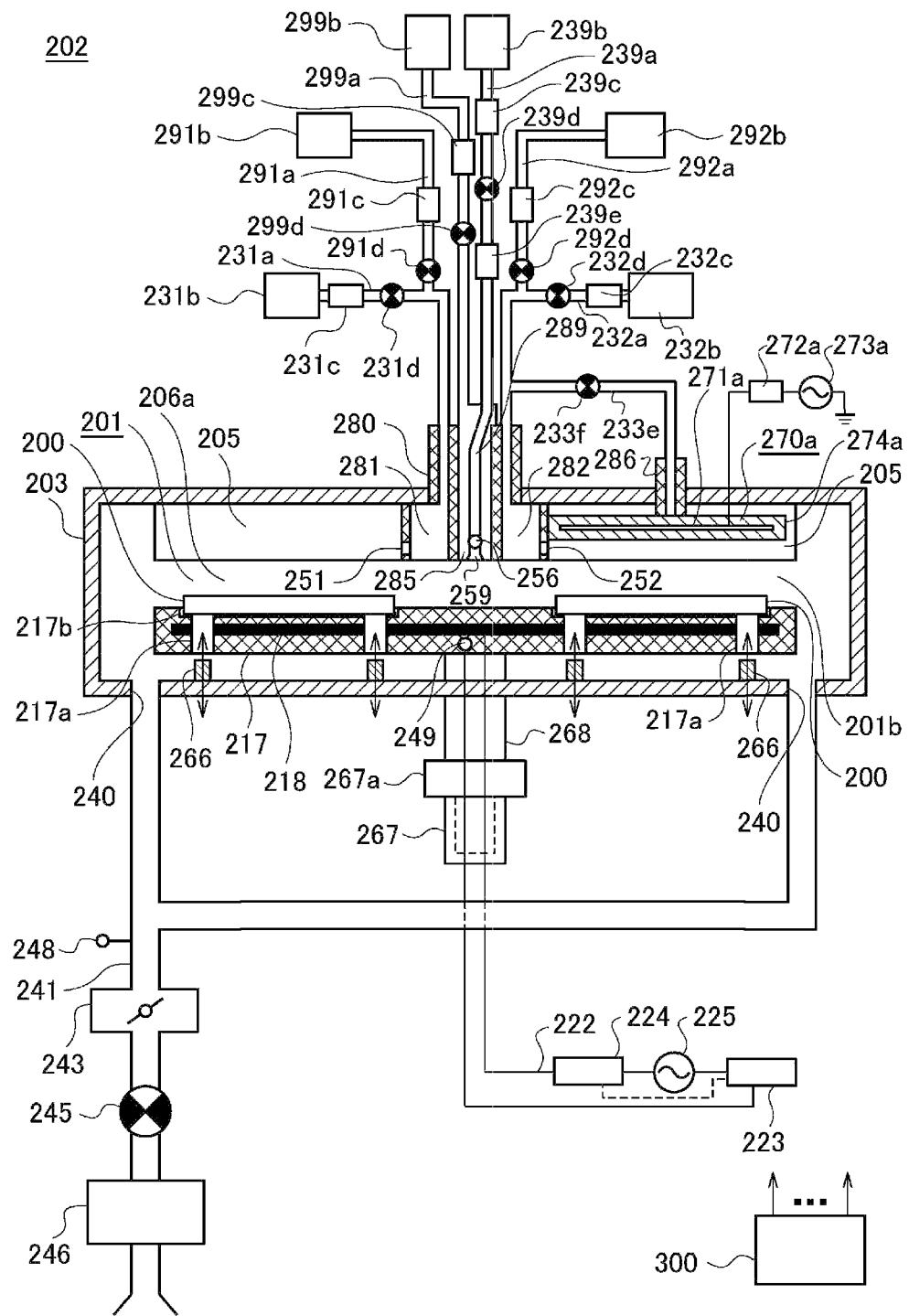
FIG. 4 is a vertical cross-sectional schematic view of the process chamber included in the substrate processing apparatus according to the first embodiment of the present invention and is a cross-sectional view of the process chamber taken along line A-A' in FIG. 3.

As illustrated in FIGS. 3 and 4, the process chamber 202 serving as a processing furnace includes the reaction container 203 that is a cylindrical airtight container. A process chamber 201 configured to process the wafer 200 is formed in the reaction container 203.

The process chamber 201 is divided into a plurality of regions, and includes, for example, a first processing region 206a, a first purge region 207a, a second processing region 206b, a third processing region 206c and a second purge region 207b. As will be described below, a source gas is supplied into the first processing region 206a, plasma of a reactive gas is generated in the second processing region 206b, and plasma of a modifying gas is generated in the third processing region 206c. Also, an inert gas is supplied into the first purge region 207a and the second purge region 207b. Therefore, a predetermined process is performed on the wafer 200 by the gas supplied into each of the regions.

Also, for example, five partition plates 205 serving as partitioning structures that radially extend from a center portion are provided at an upper side in the reaction container 203. The five partition plates 205 are configured to partition (or divide) the process chamber 201 into the first processing region 206a, the first purge region 207a, the second processing region 206b, the third processing region 206c and the second purge region 207b while the wafer 200 passes through by rotation of a susceptor 217 to be described below. Specifically, the process chamber 201 includes a gap under the plurality of partition plates 205 where the wafer 200 passes through. The plurality of partition plates 205 are provided to block a space immediately above the susceptor 217 from a ceiling portion in the process chamber 201. A lower end of the partition plate 205 is disposed adjacent to the susceptor 217 to an extent that the partition plate 205 does not interfere with the wafer 200. Accordingly, an amount of a gas that passes between the partition plate 205 and the susceptor 217 decreases, and thus mixing of the gases between regions in the process chamber 201 is suppressed.

Also, a gap of a predetermined width is provided between an end of the partition plate 205 in a horizontal direction and a sidewall of the reaction container 203 such that a gas passes through. The inert gas is ejected from insides of the first purge region 207a and the second purge region 207b into the first processing region 206a and the second processing region 206b with the gap therebetween. Accordingly, it is possible to suppress a processing gas such as a first gas and a second gas from being introduced into the first purge region 207a and the second purge region 207b, and it is possible to suppress a reaction of the processing gas in the first purge region 207a and the second purge region 207b.

Here, a time taken for the predetermined wafer 200 to pass through the first processing region 206a, the first purge region 207a, the second processing region 206b, the third processing region 206c and the second purge region 207b, that is, a processing time taken for the wafer 200 at each of the regions depends on an area (volume) of each of the regions when the susceptor 217 to be described below has a constant rotation speed. Also, when the susceptor 217 to be described below has a constant rotation speed, the processing time of the wafer 200 at each of the regions depends on each area of the first processing region 206a, the first purge region 207a, the second processing region 206b, the third processing region 206c and the second purge region 207b in a plan view. In other words, the processing time of the wafer 200 at each of the regions depends on an angle of the adjacent partition plate 205.

In the present embodiment, the third processing region 206c in which plasma of the modifying gas is generated is larger than the second processing region 206b in which plasma of the reactive gas is generated. A combined area of the second processing region 206b and the third processing region 206c is larger than the first processing region 206a. Also, the second processing region 206b in which plasma of the reactive gas is generated is provided adjacent to the third processing region 206c in which plasma of the modifying gas is generated with the partition plate 205 therebetween. Accordingly, a radiation time of plasma may be increased. Therefore, modification (such as removing impurities) of a film may be efficiently performed.

[Susceptor]

At a lower side of the partition plate 205, that is, at a bottom center in the reaction container 203, for example, the susceptor 217 that has an axis of rotation at the center of the reaction container 203 and serves as a substrate placement unit that is rotatable is provided. The susceptor 217 is made of a nonmetallic material, for example, aluminum nitride (AlN), ceramics, or quartz in order to decrease metal contamination of the wafer 200. Also, the susceptor 217 and the reaction container 203 are electrically insulated.

The susceptor 217 is configured to arrange and support the plurality (five) of wafers 200 on the same plane and on the same circumference in a rotation direction in the reaction container 203. Here, the term "the same plane" is not limited to exactly the same plane, but merely indicates that the plurality of wafers 200 are arranged not to be stacked when the susceptor 217 is seen from the top.

A wafer placement unit 217b is provided at a support position of the wafer 200 on a surface of the susceptor 217. The same number of the wafer placement units 217b as the number of wafers 200 to be processed are concentrically disposed at equal intervals from the center of the susceptor 217 (for example, an interval of 72°).

Each of the wafer placement units 217b has, for example, a circular shape seen from the top of the susceptor 217, and has a concave shape seen from the side. Preferably, the wafer placement unit 217b has a diameter that is slightly increased than a diameter of the wafer 200. When the wafer 200 is placed in the wafer placement unit 217b, a position of the wafer 200 may be easily determined. Also, it is possible to suppress a position deviation of the wafer 200 such as the wafer 200 protruding from the susceptor 217 due to centrifugal force resulting from rotation of the susceptor 217.

A lifting mechanism 268 configured to lift the susceptor 217 is provided in the susceptor 217. A plurality of through holes 217a is provided in a position of each of the wafer placement units 217b of the susceptor 217. At a bottom surface of the above-described reaction container 203, a plurality of wafer lift pins 266 configured to lift the wafer 200 and support a rear surface of the wafer 200 when the wafer 200 is loaded or unloaded into or from the reaction container 203 are provided. The through hole 217a and the wafer lift pin 266 are disposed such that the wafer lift pin 266 passes through the through hole 217a in non-contact with the susceptor 217 when the wafer lift pin 266 is raised or when the susceptor 217 is lowered by the lifting mechanism 268.

In the lifting mechanism 268, a rotating mechanism 267 configured to rotate the susceptor 217 such that the plurality of wafers 200 sequentially pass through the first processing region 206a, the first purge region 207a, the second processing region 206b, the third processing region 206c and the second purge region 207b is provided. An axis of rotation (not illustrated) of the rotating mechanism 267 is connected to the susceptor 217 and is configured such that the five wafer placement units 217b rotate in a collective manner by rotating the susceptor 217.

Also, a controller 300 to be described below is connected to the rotating mechanism 267 through a coupling portion 267a. The coupling portion 267a is configured as, for example, a slip ring mechanism configured to electrically connect between a rotation side and a fixed side by a metal brush and the like. Accordingly, rotation of the susceptor 217 is not interfered.

[Heating Unit]

A heater 218 serving as a heating unit is integrally embedded in the susceptor 217 in order to heat the wafer 200. The heater 218 is configured to heat a surface of the wafer 200 to a predetermined temperature (for example, room temperature to 1,000° C.). Also, the heater 218 may be configured to individually heat each of the wafers 200 that are placed in the susceptor 217.

A temperature sensor 249 is provided in the susceptor 217. A power regulator 224, a heater power source 225 and a temperature regulator 223 are electrically connected to the heater 218 and the temperature sensor 249 through a power supply line 222.

[Gas Inlet]

As illustrated in FIGS. 3 and 4, at a center portion of a ceiling portion of the reaction container 203, a gas inlet 280 including a first gas inlet 281, a second gas inlet 282, an inert gas inlet 285 and a cleaning gas inlet 289 is provided. An opening that is formed at the ceiling portion of the reaction container 203 is hermetically connected to an upper end of the gas inlet 280.

The gas inlet 280 has, for example, a cylindrical shape. In the gas inlet 280, divided gas inlets are provided. Specifically, the first gas inlet 281 is provided at the first processing region 206a side in the gas inlet 280. At the second processing region 206b side in the gas inlet 280, the second gas inlet 282 is provided to be separated from the first gas inlet 281. At the third processing region 206c side in the gas inlet 280, a third gas inlet 283 is provided to be separated from the first gas inlet 281 and the second gas inlet 282. In the gas inlet 280, the inert gas inlet 285 is provided among the first gas inlet 281, the second gas inlet 282 and the third gas inlet 283. Also, the cleaning gas inlet 289 is provided at the center of the gas inlet 280.

At a sidewall of the first processing region 206a side of the first gas inlet 281, a first gas outlet 251 that is open to the first processing region 206a is provided. At a sidewall of the second processing region 206b side of the second gas inlet 282, a second gas outlet 252 that is open to the second processing region 206b is provided. At a sidewall of the third processing region 206c side of the third gas inlet 283, a third gas outlet 253 that is open to the third processing region 206c is provided.

At sidewalls of the first purge region 207a side and the second purge region 207b side of the inert gas inlet 285, a first inert gas outlet 256 that is open to the first purge region 207a and a second inert gas outlet 257 that is open to the second purge region 207b are provided, respectively.

A cleaning gas supply hole 259 that is an end of the cleaning gas inlet 289 is provided at a bottom of the gas inlet 280. That is, the cleaning gas supply hole 259 is provided at a position lower than the first gas outlet 251, the second gas outlet 252, the third gas outlet 253 and each of the inert gas outlets 256 and 257.

Also, in the present embodiment, a gas inlet is provided to supply a gas to each plasma generating unit to be described below.

A gas inlet 286 of a first plasma generating unit side is provided at a ceiling portion in the second processing region 206b of the reaction container 203. An upper end of the gas inlet 286 of the first plasma generating unit side is hermetically connected to an opening formed at a ceiling of the reaction container 203. A lower end of the gas inlet 286 of the first plasma generating unit side is connected to an upper portion of a reactive gas plasma generating unit 270a to be described below. In the reactive gas plasma generating unit 270a, a gas introducing path (not illustrated) is provided in an extending direction of a pair of rod-shaped electrodes 271a to be described below. In the gas introducing path, a plurality of gas outlets (not illustrated) is provided at equal intervals. Accordingly, the reactive gas plasma generating unit 270a is configured to supply the reactive gas into the second processing region 206b through the gas inlet 286 of the first plasma generating unit side when plasma is generated.

Also, similar to the gas inlet 286 of the first plasma generating unit side, a gas inlet 287 of a second plasma generating unit side is provided at a ceiling portion in the third processing region 206c of the reaction container 203. A modifying gas plasma generating unit 270b to be described below is configured to supply the reactive gas into the third processing region 206c through the gas inlet 287 of the second plasma generating unit side with the gas introducing path (not illustrated) and the gas outlet therebetween when plasma is generated.

[Process Gas Supply System]

Figure 5:
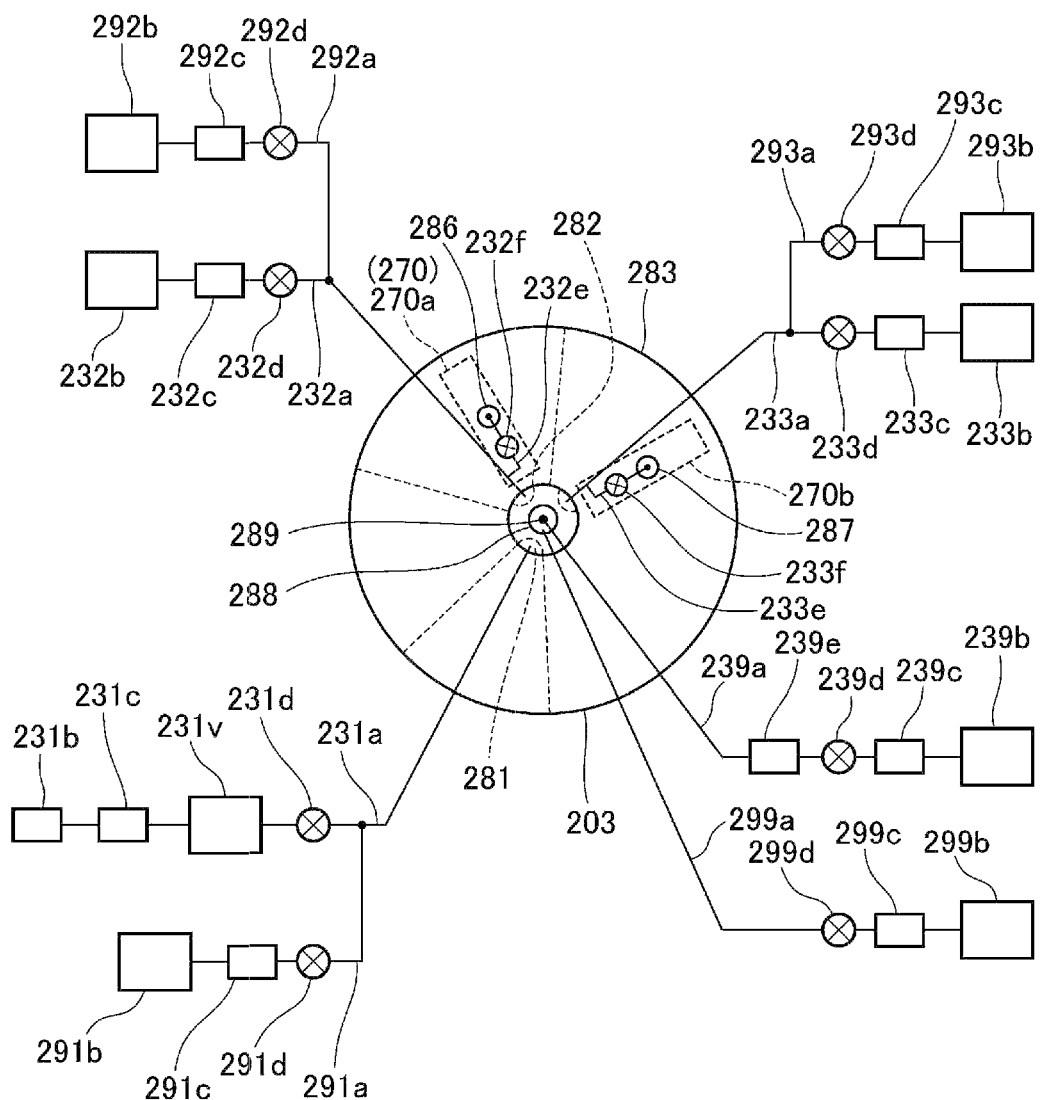
FIG. 5 is a top schematic view of the process chamber included in the substrate processing apparatus according to the first embodiment of the present invention.

As illustrated in FIG. 5, a downstream end of a first gas supply pipe 231a is connected to an upper end of the first gas inlet 281. In the first gas supply pipe 231a, in order from an upstream end, a source gas supply source 231b, a mass flow controller (MFC) 231c serving as a flow rate controller (flow rate control unit) and a valve 231d serving as an on-off valve are provided.

Through the first gas supply pipe 231a, a gas containing a first element (hereinafter referred to as a "first element-containing gas") is supplied into the first processing region 206a through the MFC 231c, the valve 231d, the first gas inlet 281 and the first gas outlet 251. In the present embodiment, the first element-containing gas is used as the source gas.

Here, the term "source gas" refers to one of the processing gases and is a gas that serves as a source when a thin film is formed. The source gas includes, for example, at least one of titanium (Ti), tantalum (Ta), silicon (Si), hafnium (Hf), zirconium (Zr), ruthenium (Ru), nickel (Ni), niobium (Nb), aluminum (Al), molybdenum (Mo) and tungsten (W) as a first element that forms a thin film.

When a metal-based thin film is formed, for example, a metallic element such as titanium tetrachloride (TiCl4) gas, titanium tetrafluoride (TiF4) gas, zirconium tetrachloride (ZrCl4) gas, zirconium tetrafluoride (ZrF4) gas, hafnium tetrachloride (HfCl4) gas, hafnium tetrafluoride (HfF4) gas, tantalum pentachloride (TaCl5) gas, tantalum pentafluoride (TaF5) gas, niobium pentachloride (NbCl5) gas, niobium pentafluoride (NbF5) gas, aluminum trichloride (AlCl3) gas, aluminum trifluoride (AlF3) gas, molybdenum pentachloride (MoCl5) gas, molybdenum pentafluoride (MoF5) gas, tungsten hexachloride (WCl6) gas and tungsten hexafluoride (WF6) gas and an inorganic metal gas containing a halogen element may be used. Also, as a source, for example, a metallic element such as trimethyl aluminum [Al(CH3)3, abbreviated to: TMA] gas and an organic metal gas containing C may be used as a source.

When an silicon-containing film is formed, as the source gas, for example, an inorganic source gas such as dichlorosilane (SiH2Cl2, abbreviated to: DCS) gas, monochlorosilane (SiH3Cl, abbreviated to: MCS) gas, hexachlorodisilane (Si2Cl6, abbreviated to: HCDS) gas, tetrachlorosilane, that is, silicon tetrachloride (SiCl4, abbreviated to: STC) gas, trichlorosilane (SiHCl3, abbreviated to: TCS) gas, tetrafluorosilane (SiF4, abbreviated to: TFS) gas, hexafluoro disilane (Si2F6, abbreviated to: HFDS) gas, trisilane (Si3H8, abbreviated to: TS) gas, disilane (Si2H6, abbreviated to: DS) gas or monosilane (SiH4, abbreviated to: MS) gas or an organic source gas such as aminosilane, TSA gas, tetrakis(dimethylamino)silane (Si[N(CH3)2]4,abbreviated to: 4DMAS) gas, tris(dimethylamino)silane (Si[N(CH3)2]3H, abbreviated to: 3DMAS) gas, bis(diethylamino)silane (Si[N(C2H5)2]2H2, abbreviated to: BDEAS) gas or bis(tertiary-butylamino)silane(SiH2[NH(C4H9)]2, abbreviated to: BTBAS) gas may be used.

Also, the source gas includes a ligand that is desorbed when the thin film is formed in addition to an element forming the thin film and the like, and includes, for example, a halogen group. When the source gas adsorbed onto the substrate and plasma of the reactive gas to be described below insufficiently react, the halogen group may remain in the thin film as residues (residual elements).

Also, in the present embodiment, as a source containing a predetermined element (first element), for example, a titanium-containing gas that contains titanium (Ti) as the predetermined element is supplied into the first processing region 206a through the first gas supply pipe 231a with the MFC 231c, the valve 231d, the first gas inlet 281 and the first gas outlet 251.

Specifically, in the present embodiment, the source gas is, for example, TiCl4 gas. When a material of the source gas is a liquid at room temperature such as TiCl4, the MFC 231c is a mass flow controller for a liquid, and a vaporizer 231v is provided between the MFC 231c and the valve 231d. Also, when the material of the source gas is a gas at room temperature, the MFC 231c is a mass flow controller for a gas and the vaporizer 231v is unnecessary.

A source gas supply system (first gas supply system) mainly includes the first gas supply pipe 231a, the MFC 231c, the valve 231d, the first gas inlet 281 and the first gas outlet 251. Also, the source gas supply source 231b and the vaporizer 231v may be included in the source gas supply system.

Also, a downstream end of a second gas supply pipe 232a is connected to an upper end of the second gas inlet 282. In the second gas supply pipe 232a, in order from an upstream end, a second gas supply source 232b, an MFC 232c and a valve 232d are provided.

Also, an upstream end of a gas supply pipe 232e of the first plasma generating unit side is connected to a downstream side from the valve 232d of the second gas supply pipe 232a. A downstream end of the gas supply pipe 232e of the first plasma generating unit side is connected to an upper end of the gas inlet 286 of the first plasma generating unit side. A valve 232f serving as an on-off valve is provided in the gas supply pipe 232e of the first plasma generating unit side.

Through the second gas supply pipe 232a, a gas containing a second element (hereinafter referred to as a "second element-containing gas") is supplied into the second processing region 206b with the MFC 232c, the valve 232d, the second gas inlet 282 and the second gas outlet 252 therebetween or with the gas supply pipe 232e of the first plasma generating unit side, the valve 232f and the gas introducing path and the gas outlet in the reactive gas plasma generating unit 270a therebetween. The second element-containing gas is used as the reactive gas. The reactive gas becomes a plasma state by the reactive gas plasma generating unit 270a and is radiated onto the wafer 200.

The term "second element-containing gas" herein refers to one of the processing gases and is a gas that becomes a plasma state and reacts with a first element-containing layer (hereinafter, it may be abbreviated to a first layer) that is formed on the wafer 200 by the source gas as will be described below. The second element-containing gas contains a second element other than the first element. The second element is, for example, any or combinations of oxygen (O), nitrogen (N) and carbon (C). For example, the second element-containing gas (reactive gas) may be at least one or combinations of ammonia ($NH_3$) gas, nitrogen ($N_2$) gas, hydrogen ($H_2$) gas and oxygen ($O_2$) gas. In the present embodiment, the second element-containing gas (reactive gas) is, for example, a nitrogen-containing gas.

In the present embodiment, through the second gas supply pipe 232a, as a reactant that contains an element (second to fourth elements) other than the above-described predetermined element, for example, a nitrogen-containing gas as the reactive gas is supplied to the second processing region 206b with the MFC 232c, the valve 232d, the second gas inlet 282 and the second gas outlet 252 therebetween or with the gas supply pipe 232e of the first plasma generating unit side, the valve 232f, and the gas introducing path and the gas outlet in the reactive gas plasma generating unit 270a therebetween. As the nitrogen-containing gas, for example, a nitride hydrogen-based gas may be used. The nitride hydrogen-based gas may be a material that consists of only two elements N and H, and serves as a nitride gas, that is, an N source in a substrate processing process to be described below. As the nitride hydrogen-based gas, for example, ammonia ($NH_3$) gas may be used.

As the nitride hydrogen-based gas, in addition to ammonia gas, for example, the nitride hydrogen-based gas such as diazene ($N_2H_2$) gas, hydrazine ($N_2H_4$) gas and $N_3H_8$ gas or a gas containing a compound thereof may be used.

A reactive gas supply system (second gas supply system) mainly includes the second gas supply pipe 232a, the MFC 232c, the valve 232d, the second gas inlet 282, the second gas outlet 252, the gas supply pipe 232e of the first plasma generating unit side and the valve 232f. Also, the gas introducing path and the gas outlet in the reactive gas plasma generating unit 270a and the second gas supply source 232b may be included in the reactive gas supply system.

Also, a downstream end of a third gas supply pipe 233a is connected to an upper end of the third gas inlet 283. In the third gas supply pipe 233a, in order from an upstream end, a third gas supply source 233b, an MFC 233c and a valve 233d are provided.

Also, an upstream end of a gas supply pipe 233e of the second plasma generating unit side is connected to a downstream side from the valve 233d of the third gas supply pipe 233a. A downstream end of the gas supply pipe 233e of the second plasma generating unit side is connected to an upper end of the gas inlet 287 of the second plasma generating unit side. A valve 233f serving as an on-off valve is provided in the gas supply pipe 233e of the second plasma generating unit side.

Through the third gas supply pipe 233a, the modifying gas is supplied into the third processing region 206c with the MFC 233c, the valve 233d, the third gas inlet 283 and the third gas outlet 253 therebetween or with the gas supply pipe 233e of the second plasma generating unit side, the valve 233f, and the gas introducing path and the gas outlet in the modifying gas plasma generating unit 270b therebetween. The modifying gas becomes a plasma state by the modifying gas plasma generating unit 270b and is radiated onto the wafer 200.

The term "modifying gas" herein is one of the processing gases and is a gas that becomes a plasma state and modifies a second layer that is formed by the source gas and the reactive gas as will be described below. The modifying gas is, for example, at least one or combinations of $H_2$ gas, $N_2$ gas, $O_2$ gas, He gas and Ar gas. Also, the modifying gas is a gas other than the reactive gas among these gases. Here, the modifying gas is, for example, $H_2$ gas.

A modifying gas supply system (third gas supply system) mainly includes the third gas supply pipe 233a, the MFC 233c, the valve 233d, the third gas inlet 283, the third gas outlet 253, the gas supply pipe 233e of the second plasma generating unit side and the valve 233f. Also, the gas introducing path and the gas outlet in the modifying gas plasma generating unit 270b and the third gas supply source 233b may be included in the modifying gas supply system.

As described above, a process gas supply system mainly includes the source gas supply system, the reactive gas supply system and the modifying gas supply system.

[Inert Gas Supply System]

A downstream end of a first inert gas supply pipe 299a is connected to an upper end of the inert gas inlet 285. In the first inert gas supply pipe 299a, in order from an upstream end, an inert gas supply source 299b, an MFC 299c and a valve 299d are provided. Through the first inert gas supply pipe 299a, the inert gas is supplied into the first purge region 207a and the second purge region 207b with the MFC 299c, the valve 299d, the inert gas inlet 285, the first inert gas outlet 256 and the second inert gas outlet 257 therebetween.

The inert gas supplied into the first purge region 207a and the second purge region 207b serves as a purge gas.

Also, a downstream end of a second inert gas supply pipe 291a is connected to a downstream side from the valve 231d of the first gas supply pipe 231a. In the second inert gas supply pipe 291a, in order from an upstream end, an inert gas supply source 291b, an MFC 291c and a valve 291d are provided. Through the second inert gas supply pipe 291a, the inert gas is supplied into the first processing region 206a with the MFC 291c, the valve 291d, the first gas supply pipe 231a, the first gas inlet 281 and the first gas outlet 251 therebetween. The inert gas supplied into the first processing region 206a serves as a carrier gas or a dilution gas.

Also, a downstream end of a third inert gas supply pipe 292a is connected to a downstream side from the valve 232d of the second gas supply pipe 232a. In the third inert gas supply pipe 292a, in order from an upstream end, an inert gas supply source 292b, an MFC 292c and a valve 292d are provided. Through the third inert gas supply pipe 292a, the inert gas is supplied into the second processing region 206b with the MFC 292c, the valve 292d, the second gas supply pipe 232a, the second gas inlet 282 and the second gas outlet 252 therebetween, or with the gas supply pipe 232e of the first plasma generating unit side, the valve 232f, and the gas introducing path and the gas outlet in the reactive gas plasma generating unit 270a therebetween. Similar to the inert gas supplied into the first processing region 206a, the inert gas supplied into the second processing region 206b serves as a carrier gas or a dilution gas.

Also, a downstream end of a fourth inert gas supply pipe 293a is connected to a downstream side from the valve 233d of the third gas supply pipe 233a. In the fourth inert gas supply pipe 293a, in order from an upstream end, an inert gas supply source 293b, an MFC 293c and a valve 293d are provided. Through the fourth inert gas supply pipe 293a, the inert gas is supplied into the third processing region 206c with the MFC 293c, the valve 293d, the third gas supply pipe 233a, the third gas inlet 283 and the third gas outlet 253 therebetween or with the gas supply pipe 233e of the second plasma generating unit side, the valve 233f, and the gas introducing path and the gas outlet in the modifying gas plasma generating unit 270b therebetween. Similar to the inert gas supplied into the first processing region 206a, the inert gas supplied into the third processing region 206c serves as a carrier gas or a dilution gas.

Here, the term "inert gas" is, for example, at least one of rare gases such as nitrogen (N2) gas, helium (He) gas, neon (Ne) gas and argon (Ar) gas. Here, the inert gas may be, for example, N2 gas.

A first inert gas supply system mainly includes the first inert gas supply pipe 299a, the MFC 299c, the valve 299d, the inert gas inlet 285, the first inert gas outlet 256 and the second inert gas outlet 257. Also, the inert gas supply source 299b may be included in the first inert gas supply system.

Also, a second inert gas supply system mainly includes the second inert gas supply pipe 291a, the MFC 291c and the valve 291d. Also, the inert gas supply source 291b, the first gas supply pipe 231a, the first gas inlet 281 and the first gas outlet 251 may be included in the second inert gas supply system.

Also, a third inert gas supply system mainly includes the third inert gas supply pipe 292a, the MFC 292c and the valve 292d. Also, the inert gas supply source 292b, the second gas supply pipe 232a, the second gas inlet 282, the second gas outlet 252, the gas supply pipe 232e of the first plasma generating unit side, the valve 232f, and the gas introducing path and the gas outlet in the reactive gas plasma generating unit 270a may be included in the third inert gas supply system.

Also, a fourth inert gas supply system mainly includes the fourth inert gas supply pipe 293a, the MFC 293c and the valve 293d. Also, the inert gas supply source 293b, the third gas supply pipe 233a, the third gas inlet 283, the third gas outlet 253, the gas supply pipe 233e of the second plasma generating unit side, the valve 233f, and the gas introducing path and the gas outlet in the modifying gas plasma generating unit 270b may be included in the fourth inert gas supply system.

An inert gas supply system mainly includes the first inert gas supply system, the second inert gas supply system, the third inert gas supply system and the fourth inert gas supply system.

[Cleaning Gas Supply System]

The substrate processing apparatus 10 of the present embodiment may also include a cleaning gas supply system. For example, a downstream end of a cleaning gas supply pipe 239a is connected to an upper end of the cleaning gas inlet 289. In the cleaning gas supply pipe 239a, in order from an upstream end, a cleaning gas supply source 239b, an MFC 239c, a valve 239d and a remote plasma generating unit 239e configured to generate plasma of a cleaning gas are provided.

Through the cleaning gas supply pipe 239a, the cleaning gas is supplied into the reaction container 203 with the MFC 239c, the valve 239d, the remote plasma generating unit 239e, the cleaning gas inlet 289 and the cleaning gas supply hole 259 therebetween. When the cleaning gas becomes a plasma state by the remote plasma generating unit 239e, a by-product and the like in the reaction container 203 are cleaned by the cleaning gas. Also, the cleaning gas is, for example, at least one of nitrogen trifluoride (NF3) gas, hydrogen fluoride (HF) gas, chlorine trifluoride (ClF3) gas and fluorine (F2) gas.

[Exhaust System]

As illustrated in FIG. 4, an exhaust port 240 configured to exhaust an inside of the reaction container 203 is provided at a bottom of the reaction container 203. For example, a plurality of exhaust ports 240 are provided at bottoms of the first processing region 206a, the first purge region 207a, the second processing region 206b, the third processing region 206c and the second purge region 207b, respectively.

An upstream end of an exhaust pipe 241 is connected to each of the exhaust ports 240. For example, the exhaust pipes 241 connected to the exhaust ports 240 converge into one at a downstream side. A vacuum pump 246 serving as a vacuum exhaust device is connected to a downstream side from a part at which the exhaust pipes 241 converge with a pressure sensor 248, an auto pressure controller (APC) valve 243 serving as a pressure regulator (pressure regulating unit) and a valve 245 serving as an on-off valve therebetween, and is configured to vacuum exhaust such that a pressure in the process chamber 201 becomes a predetermined pressure (a degree of vacuum). The APC valve 243 is an on-off valve that may open or close a valve to perform vacuum exhaust or vacuum exhaust stop in the process chamber 201 and adjust a degree of valve opening to regulate a pressure in the process chamber 201. An exhaust system mainly includes an exhaust pipe 231, the APC valve 243 and the valve 245. Also, the exhaust system may include the pressure sensor 248 and the vacuum pump 246.

[Plasma Generating Unit]

As Illustrated In FIGS. 3 and 4, at least a part of the reactive gas plasma generating unit 270a is provided in an upper part in the second processing region 206b. The reactive gas plasma generating unit 270a is configured to generate plasma of the reactive gas in the second processing region 206b. By using plasma in this manner, even when the wafer 200 has a low temperature, the reactive gas may be activated to process the wafer 200.

In the second processing region 206b, for example, the pair of rod-shaped electrodes 271 a arranged in a horizontal direction are provided. The pair of electrodes 271 a are covered by a cover 274a made of, for example, quartz. The above-described introducing path of the reactive gas is provided in the cover 274a of the reactive gas plasma generating unit 270a.

A high frequency power source 273a is connected to the pair of electrodes 271a through a matching unit 272a configured to regulate an impedance. When high frequency power is applied from the high frequency power source 273a to the electrode 271a, plasma is generated in the vicinity of the pair of electrodes 271a. Also, plasma is mainly generated immediately below the pair of electrodes 271a. In this manner, the reactive gas plasma generating unit 270a generates called capacitive coupling type plasma.

For example, the pair of electrodes 271 a of the reactive gas plasma generating unit 270a are provided in a diameter direction from the center of the reaction container 203 toward the outer side in a plan view and provided in parallel to a top surface of the wafer 200. The pair of electrodes 271a are disposed on a path through which the wafer 200 passes, and also are, for example, disposed to be stacked with the center of the second processing region 206b in a plan view. A length of the pair of electrodes 271 a in a lengthwise direction is greater than a diameter of the wafer 200. Accordingly, plasma is sequentially radiated onto a whole surface of the wafer 200 that passes immediately below the pair of electrodes 271a.

The reactive gas plasma generating unit 270a mainly includes the pair of electrodes 271a. Also, the matching unit 272a and the high frequency power source 273a may be included in the reactive gas plasma generating unit 270a.

Also, as illustrated in FIG. 3, at least a part of the modifying gas plasma generating unit 270b is provided in an upper part in the third processing region 206c. As illustrated in FIG. 3, the modifying gas plasma generating unit 270b in the present embodiment has a configuration similar to the reactive gas plasma generating unit 270a, and mainly includes a pair of electrodes 271b. However, the reactive gas plasma generating unit 270a and the modifying gas plasma generating unit 270b may have different configurations.

A high frequency power source 273b is connected to the pair of electrodes 271b of the modifying gas plasma generating unit 270b through a matching unit 272b. The matching unit 272b and the high frequency power source 273b are provided separately from the matching unit 272a and the high frequency power source 273a of the reactive gas plasma generating unit 270a. Also, the matching unit 272b and the high frequency power source 273b may be included in the modifying gas plasma generating unit 270b.

[Control Unit]

Next, the controller 300 serving as a control unit (control device) of the present embodiment will be described with reference to FIG. 6.

Figure 6:
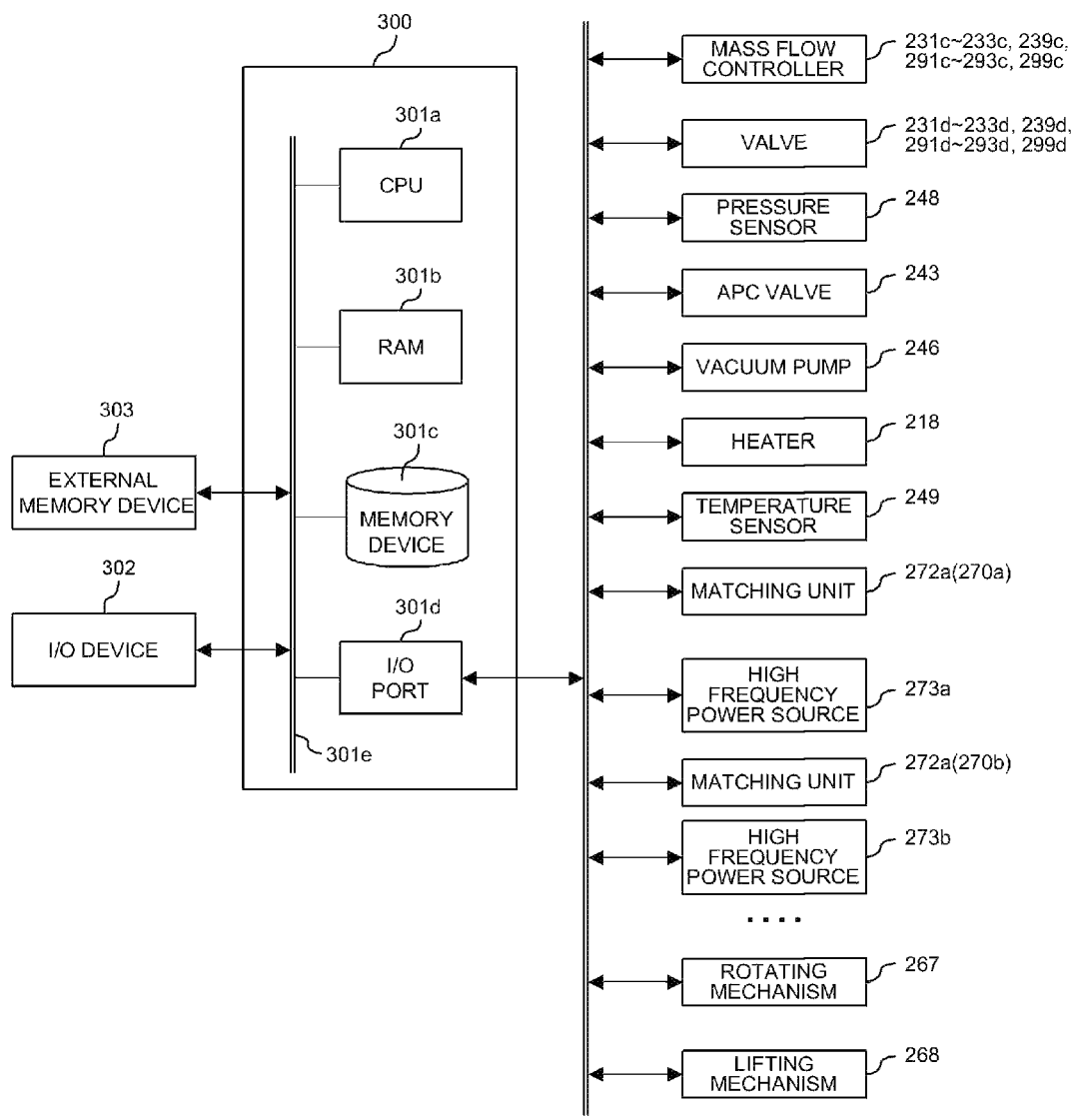
FIG. 6 is a schematic configuration diagram illustrating a controller of the substrate processing apparatus that is preferably used in the first embodiment of the present invention.

As illustrated in FIG. 6, the controller 300 serving as a control unit (control device) is configured as a computer that includes a central processing unit (CPU) 301a, a random access memory (RAM) 301b, a memory device 301c and an I/O port 301d. The RAM 301b, the memory device 301c and the I/O port 301d are configured to exchange data with the CPU 301a through an internal bus 301e. An I/O device 302 configured as, for example, a touch panel, is connected to the controller 300.

The memory device 301c is configured as, for example, a flash memory and a hard disk drive (HDD). A control program controlling operations of the substrate processing apparatus 10 or a process recipe describing sequences or conditions of substrate processing such as a film formation process to be described below are readably stored in the memory device 301c. Also, the process recipe, which is a combination of sequences, causes the controller 300 to execute each sequence in a substrate processing process to be described below in order to obtain a predetermined result, and functions as a program. Hereinafter, such a process recipe, a control program and the like are collectively simply called a "program." Also, when the term "program" is used in this specification, it may refer to either or both of the process recipe and the control program. Also, the RAM 301b is configured as a memory area (work area) in which a program, data and the like read by the CPU 301a are temporarily stored.

The I/O port 301d is connected to the MFCs 231c to 233c, 239c, 291c to 293c and 299c, the valves 231d to 233d, 239d, 291d to 293d and 299d, the pressure sensor 248, the APC valve 243, the vacuum pump 246, the heater 218, the temperature sensor 249, the high frequency power source 273a and the matching unit 272a of the reactive gas plasma generating unit 270a, the high frequency power source 273b and the matching unit 272b of the modifying gas plasma generating unit 270b, the rotating mechanism 267, the lifting mechanism 268 and the like. Also, the I/O port 301d is connected to the power regulator 224, the heater power source 225 and the temperature regulator 223 which are not illustrated.

The CPU 301a reads and executes the control program from the memory device 301c and reads the process recipe from the memory device 301c according to an input of a manipulating command from the I/O device 302. Also, to comply with the contents of the read process recipe, the CPU 301a is configured to control a flow rate regulating operation of various gases by the MFCs 231c to 233c, 239c, 291c to 293c and 299c, an open and close operation of the valves 231d to 233d, 239d, 291d to 293d and 299d, an open and close operation of the APC valve 243, a pressure regulating operation by the APC valve 243 based on the pressure sensor 248, a temperature regulating operation by the heater 218 based on the temperature sensor 249, starting and stopping of the vacuum pump 246, a rotation and rotation speed adjusting operation of the susceptor 217 by the rotating mechanism 267, a lifting operation of the susceptor 217 by the lifting mechanism 268, applying and stopping power to the reactive gas plasma generating unit 270a and the modifying gas plasma generating unit 270b by each of the high frequency power sources 273a and 273b, an impedance regulating operation by the matching units 272a and 272b.

Also, the controller 300 is not limited to being configured as a dedicated computer, but may be configured as a general-purpose computer. For example, the controller 300 according to the present embodiment may be configured by preparing an external memory device 303 [for example, a magnetic tape, a magnetic disk such as a flexible disk and a hard disk, an optical disc such as a CD or a DVD, a magneto-optical disc such as an MO and a semiconductor memory such as a USB memory and a memory card] recording the above-described program and then installing the program in the general-purpose computer using the external memory device 303. Also, a method of supplying the program to the computer is not limited to supplying through the external memory device 303. For example, a communication line such as the Internet or an exclusive line may be used to supply the program without the external memory device 303. Also, the memory device 301c or the external memory device 303 is configured as a non-transitory computer-readable recording medium. Hereinafter, these are also collectively simply called a recording medium. Also, when the term "recording medium" is used in this specification, it refers to either or both of the memory device 301c and the external memory device 303.

(3) Substrate Processing Process

Figure 7:
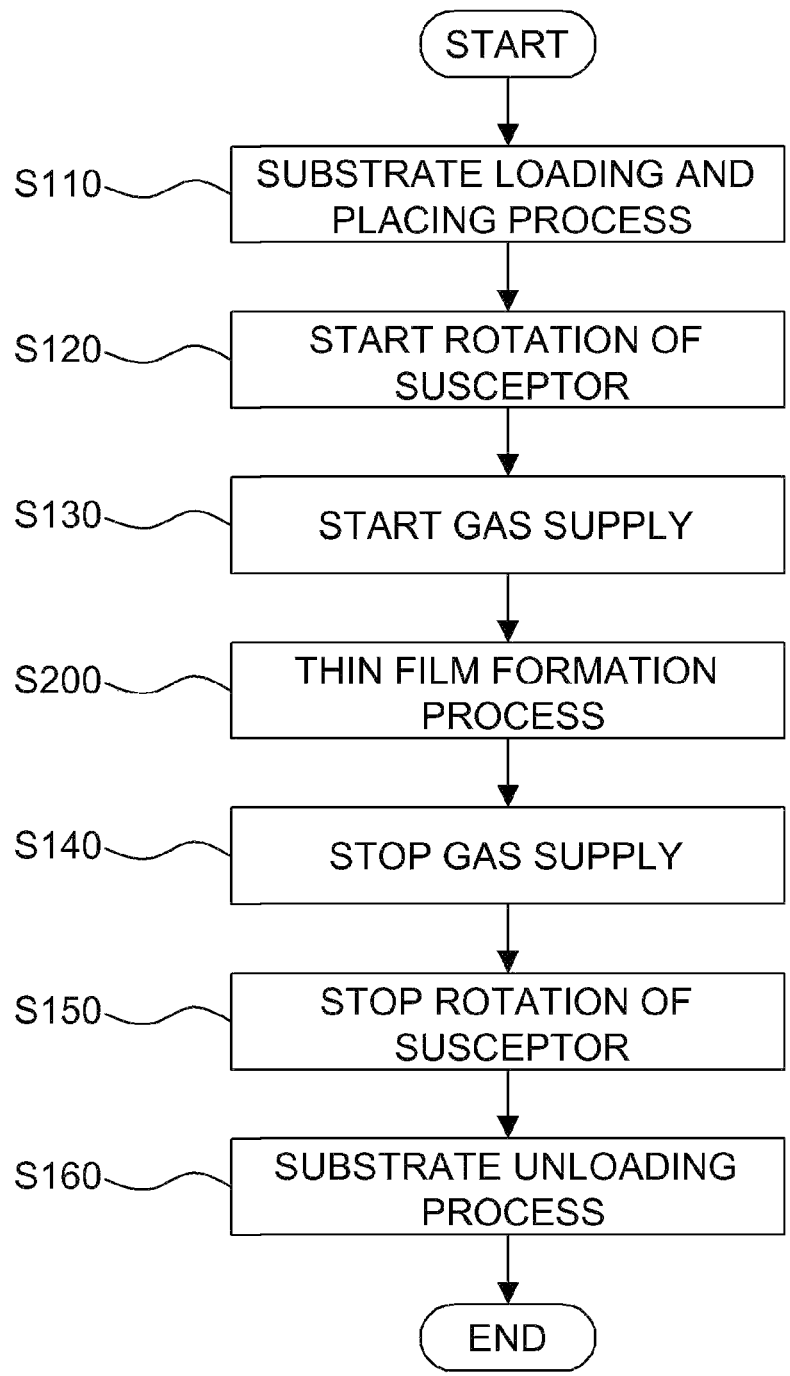
FIG. 7 is a flowchart illustrating a substrate processing process according to the first embodiment of the present invention.

Next, a substrate processing process according to the first embodiment will be described with reference to FIGS. 7 and 8. In the following description, operations of respective units constituting the process chamber 202 of the substrate processing apparatus 10 are controlled by the controller 300.

Here, an example in which TiCl4 gas is used as the source gas, NH3 gas is used as the reactive gas and H2 gas is used as the modifying gas to form a TiN film on the wafer 200 as a thin film will be described. When the term "wafer" is used in this specification, it refers to "the wafer itself," or a "laminate (aggregate) of a wafer, a predetermined layer, film, and the like formed on a surface thereof," that is, the wafer refers to a wafer including a predetermined layer, film, and the like formed on a surface thereof In addition, when the term "surface of the wafer" is used in this specification, it refers to "a surface (exposed surface) of the wafer itself" or "a surface of a predetermined layer, film, and the like formed on the wafer, that is, the outermost surface of the wafer as the laminate."

Therefore, when it is described in this specification that "a predetermined gas is supplied to the wafer," it means that "a predetermined gas is directly supplied to a surface (exposed surface) of the wafer itself" or "a predetermined gas is supplied to a layer, film, and the like formed on the wafer, that is, to the outermost surface of the wafer as the laminate." In addition, when it is described in this specification that "a predetermined layer (or film) is formed on the wafer," it means that "a predetermined layer (or film) is directly formed on a surface (exposed surface) of the wafer itself" or "a predetermined layer (or film) is formed on a layer, film, and the like formed on the wafer, that is, a predetermined layer (or film) is formed on the outermost surface of the wafer as the laminate." Also, in the present embodiment, for example, a groove portion for forming a wire or a via of a semiconductor device is formed in the wafer 200 on which the TiN film is formed.

Also, the terms "substrate" and "wafer" as used in this specification have the same meanings. Thus, the term "wafer" in the above description may be replaced with the term "substrate."

[Substrate Loading and Placing Process (S110)]

For example, the pod 100 in which a maximum of 25 wafers 200 are accommodated is transferred by an in-process transfer device and placed on the load port 105. The cap 100a of the pod 100 is removed by the pod opener 108 and a loading and unloading opening of the substrate of the pod 100 is opened. The second wafer transfer device 124 picks up the wafer 200 from the pod 100 to place on the notch aligning device 106. The notch aligning device 106 regulates a position of the wafer 200. The second wafer transfer device 124 loads the wafer 200 into the spare chamber 122 in an atmospheric pressure state through the notch aligning device 106. The gate valve 128 is closed and an inside of the spare chamber 122 is exhausted at a negative pressure by an exhaust device (not illustrated).

In the process chamber 202, when the susceptor 217 is lowered to a transfer position of the wafer 200, the wafer lift pin 266 penetrates the through hole 217a of the susceptor 217. As a result, the wafer lift pin 266 protrudes from the surface of the susceptor 217 by a predetermined height. Subsequently, a predetermined gate valve is opened and a predetermined number (for example, five) of wafers 200 (substrates to be processed) are loaded into the process chamber 201 using the first wafer transfer device 112. Then, around an axis of rotation (not illustrated) of the susceptor 217, the wafers 200 are placed not to be stacked in a rotation direction of the susceptor 217. Accordingly, the wafer 200 is supported in a horizontal orientation on the wafer lift pin 266 that protrudes from the surface of the susceptor 217.

When the wafer 200 is loaded into the process chamber 201, the first wafer transfer device 112 is discharged outside the process chamber 202, the predetermined gate valve is closed and an inside of the reaction container 203 is sealed. Then, when the susceptor 217 is raised, the wafer 200 is placed on each of the wafer placement units 217b provided in the susceptor 217.

Also, when the wafer 200 is loaded into the process chamber 201, while an inside of the process chamber 201 is exhausted by the exhaust system, N2 gas serving as the inert gas is preferably supplied into the process chamber 201 through the inert gas supply system. That is, while the inside of the process chamber 201 is exhausted by operating the vacuum pump 246 to open the APC valve 243, N2 gas is preferably supplied into the process chamber 201 by opening the valve 299d of at least the first inert gas supply system. Accordingly, it is possible to suppress particles from being introduced into the process chamber 201 and particles from being attached onto the wafer 200. Also, the inert gas may be supplied through the second inert gas supply system and the third inert gas supply system. Also, the vacuum pump 246 is continuously operated at least until the substrate loading and placing process (S110) to a substrate unloading process (S160) to be described below are completed.

When the wafer 200 is placed on the susceptor 217, the surface of the wafer 200 is controlled to have a predetermined temperature by supplying power to the heater 218 that is embedded in the susceptor 217. The temperature of the wafer 200 is, for example, room temperature or more and 750° C. or less, and preferably, room temperature or more and 400° C. or less. In this case, a temperature of the heater 218 is regulated by controlling power supply to the heater 218 based on information on a temperature detected by the temperature sensor 249. Also, the heater 218 is continuously supplied with power until at least the substrate loading and placing process (S110) to the substrate unloading process (S160) to be described below are completed.

Also, in heat treatment of the wafer 200 made of silicon, when the surface is heated to 750° C. or more, impurities of a source area, a drain area and the like formed on the surface of the wafer 200 are further diffused. Therefore, circuit characteristics are degraded and performance of the semiconductor device decreases in some cases. When the temperature of the wafer 200 is limited as described above, it is possible to suppress impurities of the source area or the drain area formed on the surface of the wafer 200 from diffusing, degradation of circuit characteristics and performance of the semiconductor device from decreasing.

[Start Rotation of Susceptor (S120)]

First, when the wafer 200 is placed on each of the wafer placement units 217b, rotation of the susceptor 217 starts by the rotating mechanism 267. In this case, a rotation speed of the susceptor 217 is controlled by the controller 300. The rotation speed of the susceptor 217 is, for example, 1 rpm or more and 100 rpm or less. Specifically, the rotation speed is, for example, 60 rpm. By rotating the susceptor 217, the wafer 200 starts to move sequentially to the first processing region 206a, the first purge region 207a, the second processing region 206b, the third processing region 206c and the second purge region 207b.

[Start Gas Supply (S130)]

When the wafer 200 is heated to a desired temperature and the susceptor 217 has a desired rotation speed, the valve 231d is opened and supply of TiCl4 gas into the first processing region 206a starts. At the same time, the valve 232d and the valve 232f are opened to supply NH3 gas into the second processing region 206b, and the valve 233d and the valve 233f are opened to supply H2 gas into the second processing region 206b.

In this case, the MFC 231c is regulated such that TiCl4 gas has a predetermined flow rate. Also, TiCl4 gas has a supply flow rate of, for example, 0.1 g/min or more and 2.0 g/min or less. Also, in addition to TiCl4 gas, N2 gas serving as the carrier gas may flow through the second inert gas supply system.

Also, the MFC 232c is regulated such that NH3 gas has a predetermined flow rate. Also, NH3 gas has a supply flow rate of, for example, 100 sccm or more and 5,000 sccm or less. Also, in addition to NH3 gas, N2 gas serving as the carrier gas may flow through the third inert gas supply system.

Also, the MFC 233c is regulated such that H2 gas has a predetermined flow rate. Also, H2 gas has a supply flow rate of, for example, 100 sccm or more and 5,000 sccm or less. Also, in addition to H2 gas, N2 gas serving as the carrier gas may flow through the fourth inert gas supply system.

Also, after the substrate loading and placing process (S110), an exhaust part continuously exhausts the inside of the process chamber 201, and N2 gas serving as the purge gas is supplied into the first purge region 207a and the second purge region 207b through the inert gas supply system. Also, by appropriately regulating a degree of opening of the APC valve 243, the inside of the process chamber 201, that is, a processing space including each of the regions in which there is the wafer 200 is set to a predetermined pressure.

[Thin Film Formation Process (S200)]

Figure 8:
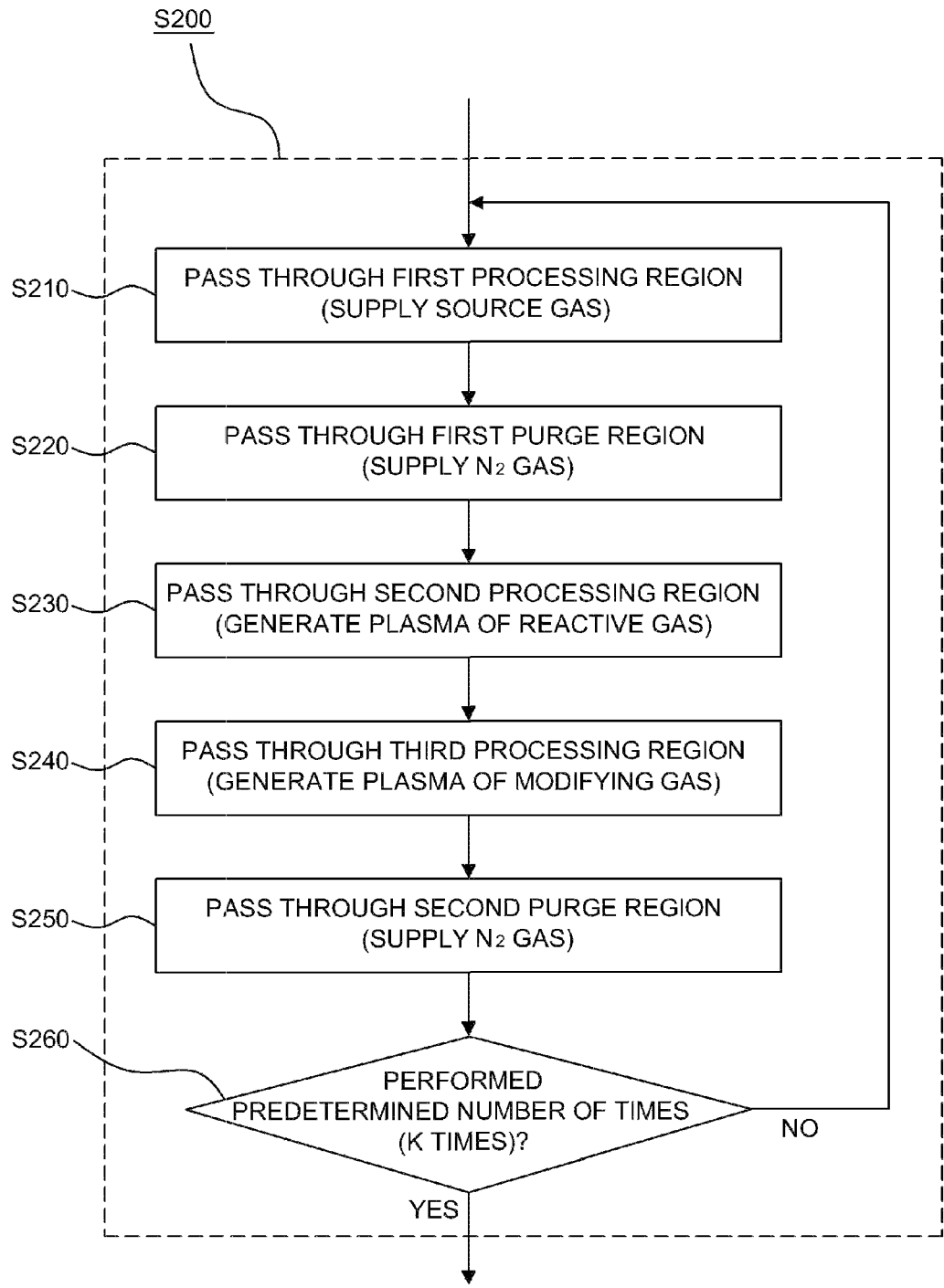
FIG. 8 is a flowchart illustrating a thin film formation process according to the first embodiment of the present invention.

Next, as illustrated in FIG. 8, in the thin film formation process (S200), in the following manner, the plurality of wafers 200 sequentially pass through the first processing region 206a, the first purge region 207a, the second processing region 206b, the third processing region 206c and the second purge region 207b by rotation of the susceptor 217.

First, when NH3 gas supplied through the second gas supply pipe 232a has a stable flow rate, the reactive gas plasma generating unit 270a starts to generate plasma of NH3 gas in the second processing region 206b. Specifically, high frequency power is applied to the pair of electrodes 271a from the high frequency power source 273a of the reactive gas plasma generating unit 270a and an impedance is regulated by the matching unit 272a. Accordingly, plasma of NH3 gas is generated below the pair of electrodes 271a in the second processing region 206b.

Also, when H2 gas supplied through the third gas supply pipe 233a has a stable flow rate, the modifying gas plasma generating unit 270b starts to generate plasma of H2 gas in the third processing region 206c. Specifically, high frequency power is applied to the pair of electrodes 271b from the high frequency power source 273b of the modifying gas plasma generating unit 270b, and an impedance is regulated by the matching unit 272b. Accordingly, plasma of H2 gas is generated below the pair of electrodes 271b in the third processing region 206c.

[Pass Through First Processing Region (S210)]

When the wafer 200 passes through the first processing region 206a, TiCl4 gas is supplied to the wafer 200. In this case, since a gas in the first processing region 206a includes only TiCl4 and the inert gas, TiCl4 gas does not react with the reactive gas or the modifying gas, but is directly attached (adhered) to the surface of the wafer 200. Accordingly, the first element-containing layer serving as the first layer is formed on the surface of the wafer 200.

The first layer is formed to have a predetermined thickness and a predetermined distribution according to, for example, a pressure in the process chamber 201, a flow rate of TiCl4 gas, a temperature of the susceptor 217, a time [a processing time for the first processing region 206a] taken for passing through the first processing region 206a and the like.

[Pass Through First Purge Region (S220)]

Next, the wafer 200 passes through the first processing region 206a, and then moves in a rotation direction R of the susceptor 217 and moves to the first purge region 207a. When the wafer 200 passes through the first purge region 207a, some of TiCl4 gas that do not form a strong bond on the wafer 200 in the first processing region 206a and the like are removed from the wafer 200 by N2 gas serving as the inert gas.

[Pass Through Second Processing Region (S230)]

Next, the wafer 200 passes through the first purge region 207a, and then moves in a rotation direction R of the susceptor 217 and moves to the second processing region 206b. When the wafer 200 passes through the second processing region 206b, the first layer reacts with plasma of NH3 gas serving as the reactive gas in the second processing region 206b. In this case, a nitrogen component among active species of NH3 gas is bound to a titanium (Ti) component of the first layer. A hydrogen component among active species of NH3 gas reacts with a chlorine (Cl) component of the first layer, becomes HCl and is desorbed from the first layer. Accordingly, a layer (or film) containing at least the first element Ti and the second element N is formed on the wafer 200. Then, the layer (or film) containing the first element and the second element may be called the second layer.

In this case, when a reaction caused by the reactive gas is insufficient, a chlorine component derived from TiCl4 serving as the source gas may remain in the second layer as residues. When the wafer 200 passes through the following first processing region 206a while residues remain, since the Ti component is sparsely adhered, film characteristics degrade due to a sparse film state. Also, the chlorine (Cl) component included in the first layer becomes impurities in the thin film. Under such circumstances, when a thin film of a desired film thickness is formed by repeating a process of forming the first layer and a process of forming the second layer, there is a concern about an uneven film density or resistance value in a depth direction of the film. Therefore, in the present embodiment, a process by plasma of the modifying gas is performed on the second layer on the wafer 200 as follows.

[Pass Through Third Processing Region (S240)]

Next, the wafer 200 passes through the second processing region 206b, and then moves in a rotation direction R of the susceptor 217 and moves to the third processing region 206c. When the wafer 200 passes through the third processing region 206c, the second layer is modified by plasma of H2 gas serving as the modifying gas in the third processing region 206c. In this case, active species of H2 gas react with Cl atoms (chloro group) serving as residues remaining in the second layer, become HCl and are desorbed from the second layer. Hereinafter, the modified second layer on the wafer 200 may be called a third layer.

The third layer is formed to have a predetermined distribution and a predetermined modified depth with respect to the second layer by modification of the second layer according to, for example, a pressure in the reaction container 203, a flow rate of H2 gas, a temperature of the susceptor 217, a power supply state of the modifying gas plasma generating unit 270b and the like.

Here, in the present embodiment, for example, the second processing region 206b in which plasma of the reactive gas is generated is provided adjacent to the third processing region 206c in which plasma of the modifying gas is generated with the partition plate 205 therebetween. Accordingly, immediately after the first layer reacts with plasma of NH3 gas and the second layer is formed, the second layer may be modified by H2 gas.

Also, in the present embodiment, preferably, the third processing region 206c is larger than the second processing region 206b. That is, a processing time for the predetermined wafer 200 in the third processing region 206c is longer than a processing time for the second processing region 206b. Accordingly, when the second layer is exposed to plasma of H2 gas in the third processing region 206c for a longer time than the second processing region 206b, it is possible to suppress the Cl component from remaining in the third layer that has completed one cycle more reliably.

Also, in the present embodiment, more preferably, plasma power applied to H2 gas serving as the modifying gas in the third processing region 206c is set to be higher than plasma power applied to NH3 gas serving as the reactive gas in the second processing region 206b. Accordingly, since plasma of H2 gas having a high plasma density is formed, it is possible to promote desorption of the Cl component from the second layer more reliably.

Also, in the present embodiment, more preferably, a plasma excitation frequency of the modifying gas plasma generating unit 270b is different from a plasma excitation frequency of the reactive gas plasma generating unit 270a, and for example, is higher than the plasma excitation frequency of the reactive gas plasma generating unit 270a. Accordingly, similar to the effect of high power, by plasma of H2 gas having a high plasma density, it is possible to promote desorption of the Cl component from the second layer more reliably.

Also, in the present embodiment, more preferably, a supply amount (=flow rate×passing time) of NH3 gas and H2 gas in total that become plasma and are radiated onto the wafer 200 in the second processing region 206b and the third processing region 206c is greater than a supply amount of TiCl4 gas that is supplied to the wafer 200 in the first processing region 206a. Specifically, a ratio of the number of moles of H atoms supplied in the second processing region 206b and the third processing region 206c with respect to the number of moles of Cl atoms of TiCl4 gas supplied in the first processing region 206a is set to be higher. Specifically, the number of moles of H atoms supplied in the second processing region 206b and the third processing region 206c is greater than the number of moles of Cl atoms of TiCl4 gas supplied in the first processing region 206a. Accordingly, even when all TiCl4 gases are adhered to the wafer 200 in the first processing region 206a, a shortage of H atoms for desorbing Cl atoms (Cl component) from the second layer is suppressed.

Also, in the present embodiment, these conditions for promoting desorption of the Cl component from the second layer may be combined for execution.

[Pass Through Second Purge Region (S250)]

Next, the wafer 200 passes through the third processing region 206c, and then moves in a rotation direction R of the susceptor 217 and moves to the second purge region 207b. When the wafer 200 passes through the second purge region 207b, HCl desorbed from the third layer on the wafer 200 in the third processing region 206c, extra H2 gas and the like are removed from the wafer 200 by N2 gas serving as the inert gas.

One cycle includes the passing through the first processing region (S210), the passing through the first purge region (S220), the passing through the second processing region (S230), the passing through the third processing region (S240) and the passing through the second purge region (S250).

[Determination (S260)]

In the meantime, the controller 300 determines whether the one cycle is performed a predetermined number of times (k times: k is an integer of 1 or more). Specifically, the controller 300 counts the number of rotations of the susceptor 217.

When the one cycle is not performed k times (No in S260), rotation of the susceptor 217 is continued further, and the cycle including the passing through the first processing region (S210), the passing through the first purge region (S220), the passing through the second processing region (S230), the passing through the third processing region (S240) and the passing through the second purge region (S250) is repeated. Accordingly, the thin film is formed by laminating the third layer.

When the one cycle is performed k times (Yes in S260), the thin film formation process (S200) ends. In this manner, when the one cycle is performed k times, a thin film having a predetermined film thickness in which the third layer is laminated is formed.

Also, the TiN film formed in the present embodiment may include a Ti—N—H group (bond) by including H atoms of NH3 gas serving as the reactive gas.

[Stop Gas Supply (S140)]

After the thin film formation process (S200), the valves 231d, 232d and 233d are closed to stop supply of TiCl4 gas to the first processing region 206a, supply of NH3 gas to the second processing region 206b and supply of H2 gas to the third processing region 206c.

[Stop Rotation of Susceptor (S150)]

After the Stop of Gas Supply (S140), rotation of the susceptor 217 is stopped.

[Substrate Unloading Process (S160)]

Next, the susceptor 217 is lowered and the wafer 200 is supported on the wafer lift pins 266 that protrude from the surface of the susceptor 217. Then, the predetermined gate valve is opened and the wafer 200 is unloaded outside the reaction container 203 using the first wafer transfer device 112. Also, supply of N2 gas serving as the inert gas into the process chamber 201 by the inert gas supply system is stopped.

According to the above process, the substrate processing process ends. Also, after the substrate processing process ends, NF3 gas serving as the cleaning gas may be supplied into the process chamber 201 through the cleaning gas supply system to clean the inside of the process chamber 201.

(4) Effects According to the Present Embodiment

According to the present embodiment, one or a plurality of effects to be described below are obtained. According to the present embodiment, the plurality of wafers 200 sequentially pass through the first processing region 206a, the second processing region 206b and the third processing region 206c by rotation of the susceptor 217, when the wafer 200 passes through the first processing region 206a, the source gas is supplied onto the wafer 200 to form the first layer, when the wafer 200 passes through the second processing region 206b, plasma of the reactive gas generated by the reactive gas plasma generating unit 270a reacts with the first layer to form the second layer, and when the wafer 200 passes through the third processing region 206c, the second layer is modified by plasma of the modifying gas generated by the modifying gas plasma generating unit 270b to form the third layer. A cycle including formation of the first layer to formation of the third layer is repeated to laminate the third layer, thereby forming the thin film. Accordingly, without remaining residues such as some components of molecules of the source gas in the thin film that is formed on the substrate due to an insufficient reaction by the reactive gas, a high quality thin film may be formed. Also, since plasma of the reactive gas may not be uniformly delivered to the vicinity of a bottom surface of the groove portion for forming a wire of the semiconductor device of the wafer, a film density of the thin film may decrease. A phenomenon in which the film density of the thin film decreases tends to be significant particularly when the groove portion has a high aspect ratio or when the susceptor has a high rotation speed. In such a case, according to the present embodiment, even when residues such as some components of molecules of the source gas remain in the thin film, an abundance ratio of residues in the thin film does not increase and a high quality thin film may be formed. Also, according to the present embodiment, the second layer is formed on the wafer 200 and then the wafer 200 passes through the third processing region 206c in which plasma of the modifying gas is generated. In this case, residues remaining in the second layer are desorbed from the second layer by plasma of the modifying gas, and thus the third layer is formed. In this manner, one cycle includes formation of the first layer to formation of the third layer, and the third layer in which remaining of residues is suppressed is formed for each one cycle, or formation of the third layer is repeatedly laminated. Therefore, the high quality thin film may be formed. Also, according to the present embodiment, TiCl4 gas is used as the source gas, NH3 gas is used as the reactive gas and H2 gas is used as the modifying gas. Therefore, the TiN film is formed as the thin film. When the wafer 200 passes through the second processing region 206b, Cl atoms (chloro group) serving as residues remaining in the second layer become HCl by plasma of H2 gas and are desorbed from the second layer. Accordingly, by laminating the third layer in which Cl atoms decrease, the TiN film of a high quality may be formed. By decreasing Cl atoms serving as impurities, a contact resistance of the TiN film to a semiconductor or a metal may decrease, and when the film is used as a diffusion barrier layer, it is possible to increase a barrier property against diffusion of a metal such as Cu. Also, according to the present embodiment, plasma power applied to H2 gas serving as the modifying gas in the third processing region 206c is set to be higher than plasma power applied to NH3 gas serving as the reactive gas in the second processing region 206b. Here, Cl atoms remaining in the second layer may be strongly bound to Ti atoms despite being exposed to plasma of NH3 gas in the second processing region 206b. When Cl atoms that have been strongly bound to Ti atoms react with plasma of the modifying gas having a high plasma density, it is possible to promote desorption of Cl atoms serving as residues from the second layer. Also, according to the present embodiment, a plasma excitation frequency of the modifying gas plasma generating unit 270b is different from a plasma excitation frequency of the reactive gas plasma generating unit 270a, and for example, is higher than the plasma excitation frequency of the reactive gas plasma generating unit 270a.

Accordingly, similar to the effect of high power, it is possible to generate plasma of H2 gas having a high plasma density and promote desorption of Cl atoms from the second layer. Also, according to the present embodiment, the plurality of partition plates 205 are configured to divide the process chamber 201 into the first processing region 206a, the second processing region 206b and the third processing region 206c while the wafer 200 can pass through by rotation of the susceptor 217. The process chamber 201 includes a gap through which the wafer 200 can pass below the plurality of partition plates 205. Accordingly, an amount of a gas that passes between the partition plate 205 and the susceptor 217 decreases, and thus mixing of the gas between regions in the process chamber 201 is suppressed. Also, according to the present embodiment, the third processing region 206c is larger than the second processing region 206b. That is, a processing time for the predetermined wafer 200 in the third processing region 206c is longer than a processing time for the second processing region 206b. Accordingly, since the second layer is exposed to plasma of H2 gas in the third processing region 206c for a longer time than the second processing region 206b and Cl atoms are desorbed more reliably, Cl atoms remaining in the third layer that has completed one cycle are suppressed. Also, according to the present embodiment, the third processing region 206c is larger than the second processing region 206b. Accordingly, since a radiation time of plasma may be set to be longer, it is possible to increase modification efficiency in the above-described one cycle. Since modification (such as removal of impurities) of the film is more difficult to be proceeded than a reaction (such as oxidation and nitrization), it is necessary to increase a plasma intensity or increase a plasma radiation time. There are limitations of hardware or cost in order to increase the plasma intensity. However, when a region is set to be larger in order to increase a radiation time of plasma as in the present embodiment, it is possible to increase modification efficiency in one cycle without major device modification. The above-described effects may also be obtained when a gas other than TiCl4 gas is used as the source gas, a gas other than NH3 gas is used as the nitrogen-containing gas and an inert gas other than N2 gas is used as the purge gas.

Second Embodiment of the Present Invention

Hereinafter, the second embodiment of the present invention will be described. The present embodiment is different from the first embodiment in that the process chamber 202 of the substrate processing apparatus 10 includes a fourth processing region. In the present embodiment, the above-described substrate processing apparatus 10 is used, and the other configurations of the present embodiment are the same as those in the first embodiment. Hereinafter, only components different from the first embodiment will be described, and substantially the same components as the components described in the first embodiment are denoted by the same reference numerals and descriptions thereof will be omitted.

(1) Configuration of Process Chamber

Figure 9:
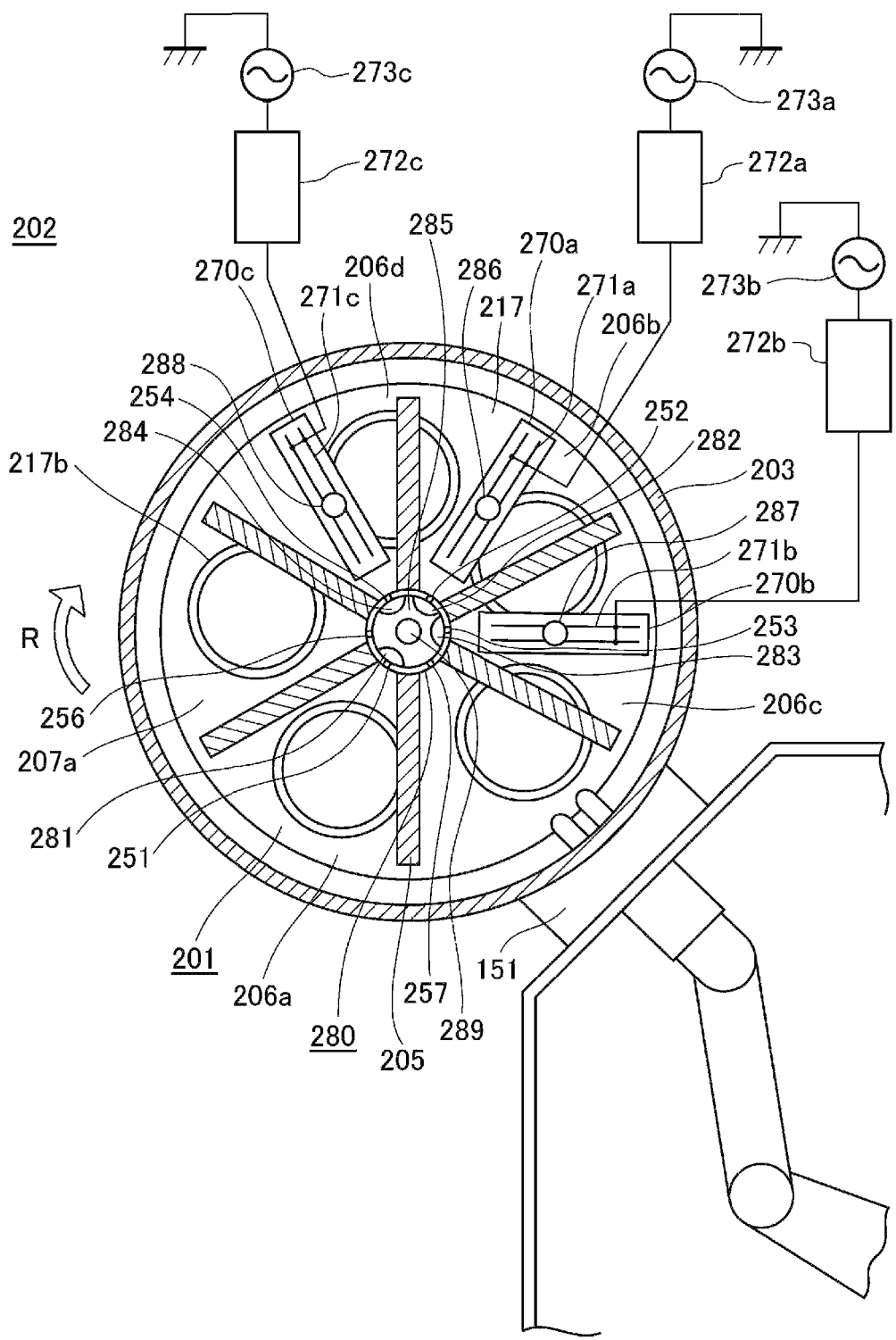
FIG. 9 is a cross-sectional schematic view of a process chamber included in a substrate processing apparatus according to a second embodiment of the present invention.

A configuration of a process chamber serving as a processing furnace according to the present embodiment will be described with reference to FIG. 9. As illustrated in FIG. 9, for example, a fourth processing region 206d is provided between the first purge region 207a and the second processing region 206b. For example, an area of the fourth processing region 206d in a plan view is the same as each area of the second processing region 206b and the third processing region 206c in a plan view. Also, the area of the second processing region 206b in a plan view is the same as the area of the third processing region 206c in a plan view.

[Fourth Gas Inlet]

A fourth gas inlet 284 is provided at the fourth processing region 206d side in the gas inlet 280. A fourth gas outlet 254 that is opened to the fourth processing region 206d is provided at a sidewall of the fourth processing region 206d side of the fourth gas inlet 284. Also, a gas inlet 288 of a third plasma generating unit side is provided at a ceiling portion in the fourth processing region 206d of the reaction container 203, similar to the gas inlet 286 of the first plasma generating unit side.

Although not illustrated, a downstream end of a fourth gas supply pipe is connected to an upper end of the fourth gas inlet 284. In the fourth gas supply pipe, in order from an upstream end, a fourth gas supply source, an MFC and a valve are provided. Also, the gas supply pipe of the third plasma generating unit side is connected to a downstream side from the valve of the fourth gas supply pipe to be connected to an upstream end of the gas inlet 286 of the first plasma generating unit side through the valve. A pre-processing gas plasma generating unit 270c to be described below is configured to supply the modifying gas into the fourth processing region 206d through the gas inlet 288 of the third plasma generating unit side with the gas introducing path (not illustrated) and the gas outlet (not illustrated) therebetween when plasma is generated.

[Pre-processing Gas Supply System]

Through the fourth gas supply pipe, the modifying gas is supplied into the fourth processing region 206d with the MFC, the valve, the fourth gas inlet 284 and the fourth gas outlet 254 therebetween or with the gas supply pipe of the third plasma generating unit side, the valve, and the gas introducing path and the gas outlet in the pre-processing gas plasma generating unit 270c therebetween. The modifying gas becomes a plasma state by the modifying gas plasma generating unit 270b and is radiated onto the wafer 200.

The term "pre-processing gas" herein is one of the processing gases and is a gas that becomes a plasma state and modifies the first layer formed by the source gas as will be described below. The pre-processing gas is, for example, at least one of H2 gas, N2 gas, O2 gas, He gas and Ar gas. Also, the pre-processing gas is a gas other than the reactive gas among these gases. Also, the pre-processing gas uses a material having a lower degree of tackiness (viscosity) than the source gas. Here, the pre-processing gas is a gas that is the same as the modifying gas, for example, H2 gas.

A pre-processing gas supply system (fourth gas supply system) mainly includes the fourth gas supply pipe, the MFC, the valve, the fourth gas inlet, the fourth gas outlet, the gas supply pipe of the third plasma generating unit side and the valve. The pre-processing gas supply system is a part of the process gas supply system. Also, the gas introducing path and the gas outlet in the pre-processing gas plasma generating unit 270c and the fourth gas supply source may be included in the pre-processing gas supply system. Also, a fifth inert gas supply system similar to the third inert gas supply system may be connected to a downstream side from the valve of the fourth gas supply pipe.

[Pre-processing Gas Plasma Generating Unit]

As illustrated in FIG. 9, at least a part of the pre-processing gas plasma generating unit 270c is provided in an upper part in the fourth processing region 206d. The pre-processing gas plasma generating unit 270c has a configuration similar to the reactive gas plasma generating unit 270a and mainly includes a pair of electrodes 271c.

A high frequency power source 273c is connected to the pair of electrodes 271c of the pre-processing gas plasma generating unit 270c through a matching unit 272c. The matching unit 272c and the high frequency power source 273c are separately provided from the matching unit 272a and the high frequency power source 273a of the reactive gas plasma generating unit 270a. Also, the matching unit 272c and the high frequency power source 273c may be included in the pre-processing gas plasma generating unit 270c.

(2) Substrate Processing Process

Figure 10:
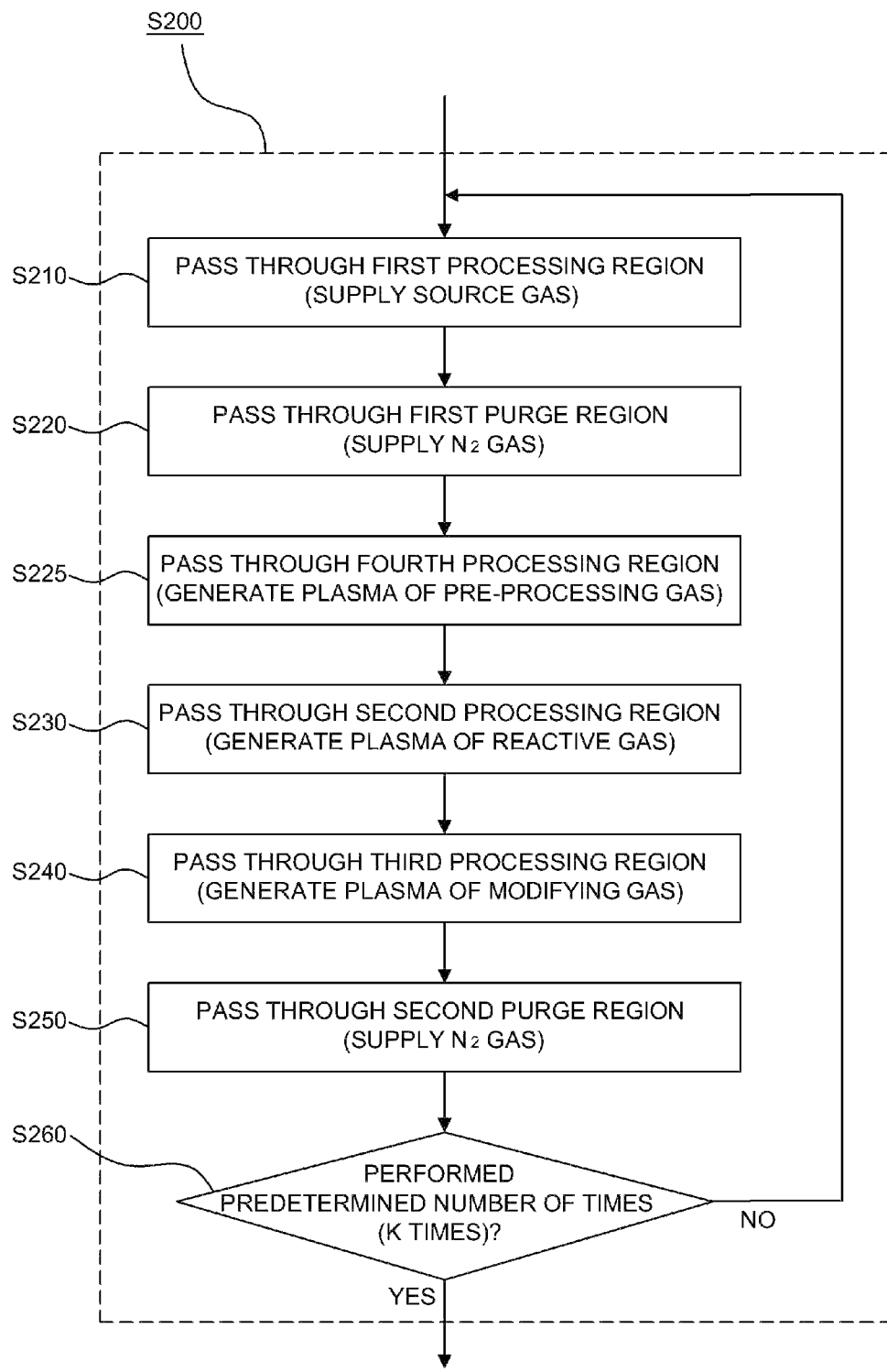
FIG. 10 is a flowchart illustrating a thin film formation process according to the second embodiment of the present invention.

Next, the substrate processing process of the present embodiment will be described with reference to FIG. 10. Hereinafter, only the thin film formation process (S200) in the present embodiment will be described.

Here, the wafer 200 passes through the first processing region 206a and the first purge region 207a, and the first layer is formed on the wafer 200.

[Pass Through Fourth Processing Region (S225)]

The wafer 200 passes through the first purge region 207a, and then moves in a rotation direction R of the susceptor 217 and moves to the fourth processing region 206d. When the wafer 200 passes through the fourth processing region 206d, the first layer is modified by plasma of H2 gas serving as the pre-processing gas in the fourth processing region 206d. In this case, active species of H2 gas react with Cl atoms that are included in the first layer and are derived from TiCl4 gas, become HCl and are desorbed from the first layer. Similar to the first embodiment, the modified first layer on the wafer 200 may be called a modified layer.

The modified layer is formed to have a predetermined distribution and a predetermined modified depth with respect to the first layer by modification of the first layer according to, for example, a pressure in the reaction container 203, a flow rate of H2 gas, a temperature of the susceptor 217, a power supply state of the pre-processing gas plasma generating unit 270c and the like.

[Pass Through Second Processing Region (S230)]

Next, the wafer 200 passes through the fourth processing region 206d, and then moves in a rotation direction R of the susceptor 217 and moves to the second processing region 206b. When the wafer 200 passes through the second processing region 206b, the modified layer reacts with plasma of NH3 gas serving as the reactive gas in the second processing region 206b. In this case, N atoms of active species of NH3 gas are bound to Ti atoms of the modified layer. H atoms of active species of NH3 gas react with Cl atoms remaining in the modified layer, become HCl and are desorbed from the modified layer. Accordingly, the modified layer on the wafer 200 further reacts with plasma of NH3 gas and the second layer is formed.

[Pass Through Third Processing Region (S240)]

Next, the wafer 200 passes through the second processing region 206b, and then moves in a rotation direction R of the susceptor 217 and moves to the third processing region 206c. When the wafer 200 passes through the third processing region 206c, the second layer is further modified by plasma of H2 gas serving as the modifying gas in the third processing region 206c. In this case, active species of H2 gas react with Cl atoms (chloro group) serving as residues remaining in the second layer, become HCl and are desorbed from the second layer. Similar to the first embodiment, the modified second layer formed on the wafer 200 may be called the third layer.

The following processes are the same as those in the first embodiment.

(3) Effects According to the Present Embodiment

According to the present embodiment, one or a plurality of effects to be described below are obtained.

According to the present embodiment, the fourth processing region 206d is provided between the first processing region 206a and the second processing region 206b. In the thin film formation process (S200), when the wafer 200 passes through the fourth processing region 206d, the first layer is modified by plasma of H2 gas serving as the pre-processing gas that is generated by the pre-processing gas plasma generating unit 270c to form the modified layer. While Cl atoms that may become residues are desorbed from the first layer, the second layer may be formed. Accordingly, the N element of NH3 gas may be easily included in the first layer. Also, when Cl atoms are desorbed from the first layer or the second layer twice during one cycle, residues finally remaining in the TiN film may be decreased.

Third Embodiment of the Present Invention

Hereinafter, the third embodiment of the present invention will be described. An area of each of the processing regions in the present embodiment is different from the first embodiment. In the present embodiment, the above-described substrate processing apparatus 10 is used, and the other configurations of the present embodiment are the same as those in the first embodiment. Hereinafter, only components different from the first embodiment will be described, and substantially the same components as the components described in the first embodiment are denoted by the same reference numerals and descriptions thereof will be omitted.

A configuration of a process chamber serving as a processing furnace according to the present embodiment will be described with reference to FIG. 11.

Figure 11:
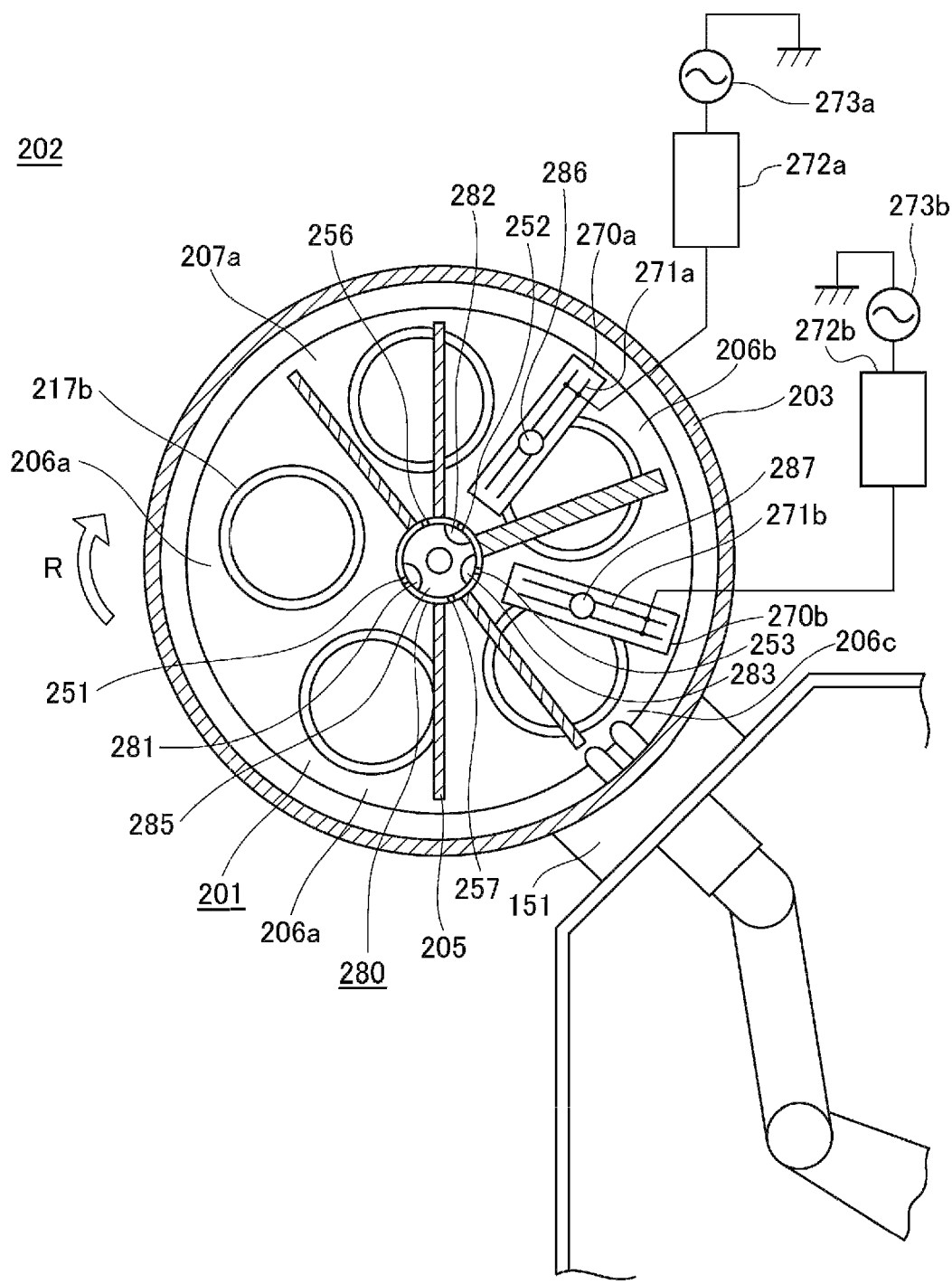
FIG. 11 is a cross-sectional schematic view of a process chamber included in a substrate processing apparatus according to a third embodiment of the present invention.

As illustrated in FIG. 11, for example, the first processing region 206a is larger than each of the second processing region 206b and the third processing region 206c. That is, a time taken for passing through the first processing region 206a is longer than each of a time taken for passing through the second processing region 206b and a time taken for passing through the third processing region 206c.

According to the present embodiment, the area of each of the processing regions may be changed according to a kind of the processing gas. For example, when the source gas supplied to the first processing region 206a is a gas that is difficult to be adhered to the wafer 200, the first processing region 206a is set to be larger than the second processing region 206b and the third processing region 206c as described above. Accordingly, when the time taken for passing through the first processing region 206a is set to be longer, the first layer may be stably formed.

Fourth Embodiment of the Present Invention

Hereinafter, the fourth embodiment of the present invention will be described. The present embodiment (the fourth embodiment) has a different configuration of the first plasma generating unit from the first embodiment (or the third embodiment). In the present embodiment, the above-described substrate processing apparatus 10 is used, and the other configurations of the present embodiment are the same as those in the first embodiment. Hereinafter, only components different from the first embodiment will be described, and substantially the same components as the components described in the first embodiment are denoted by the same reference numerals and descriptions thereof will be omitted.

A configuration of a process chamber serving as a processing furnace according to the present embodiment (the fourth embodiment) will be described with reference to FIGS. 12 and 13.

Figure 13:
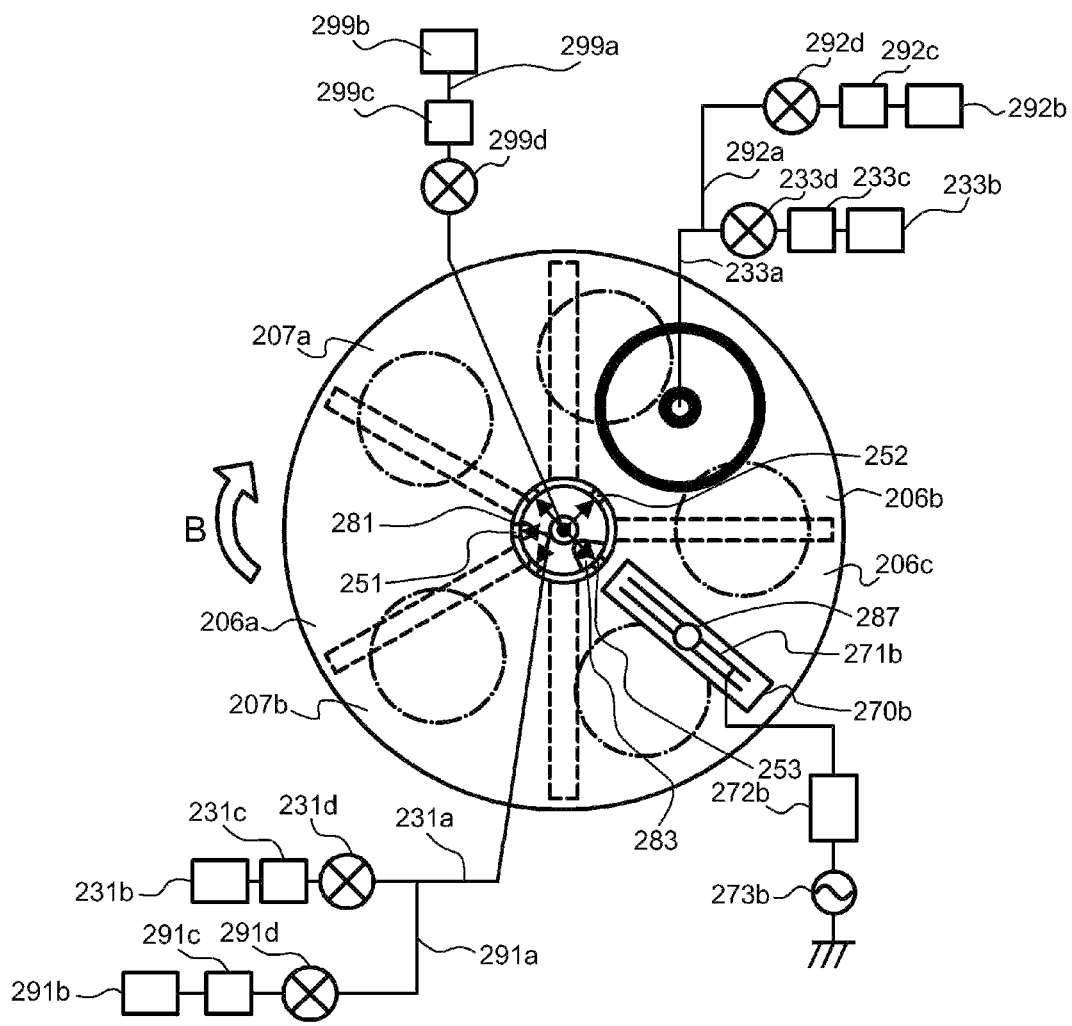
FIG. 13 is a top schematic view of the process chamber included in the substrate processing apparatus according to the fourth embodiment of the present invention.

As illustrated in FIG. 13, since a configuration in which plasma of the reactive gas plasma generating unit serving as the first plasma generating unit in the second processing region 206b is generated as inductively coupled plasma (abbreviated to: ICP) is different from that of the first embodiment (or the third embodiment), parts related to the first plasma generating unit will be described below. Also, since the controller has the same configuration as the controller of the first embodiment illustrated in FIG. 6, description thereof will be omitted. Here, the plasma generating unit and the reactive gas supply system will be described in detail.

[Plasma Generating Unit]

Figure 12:
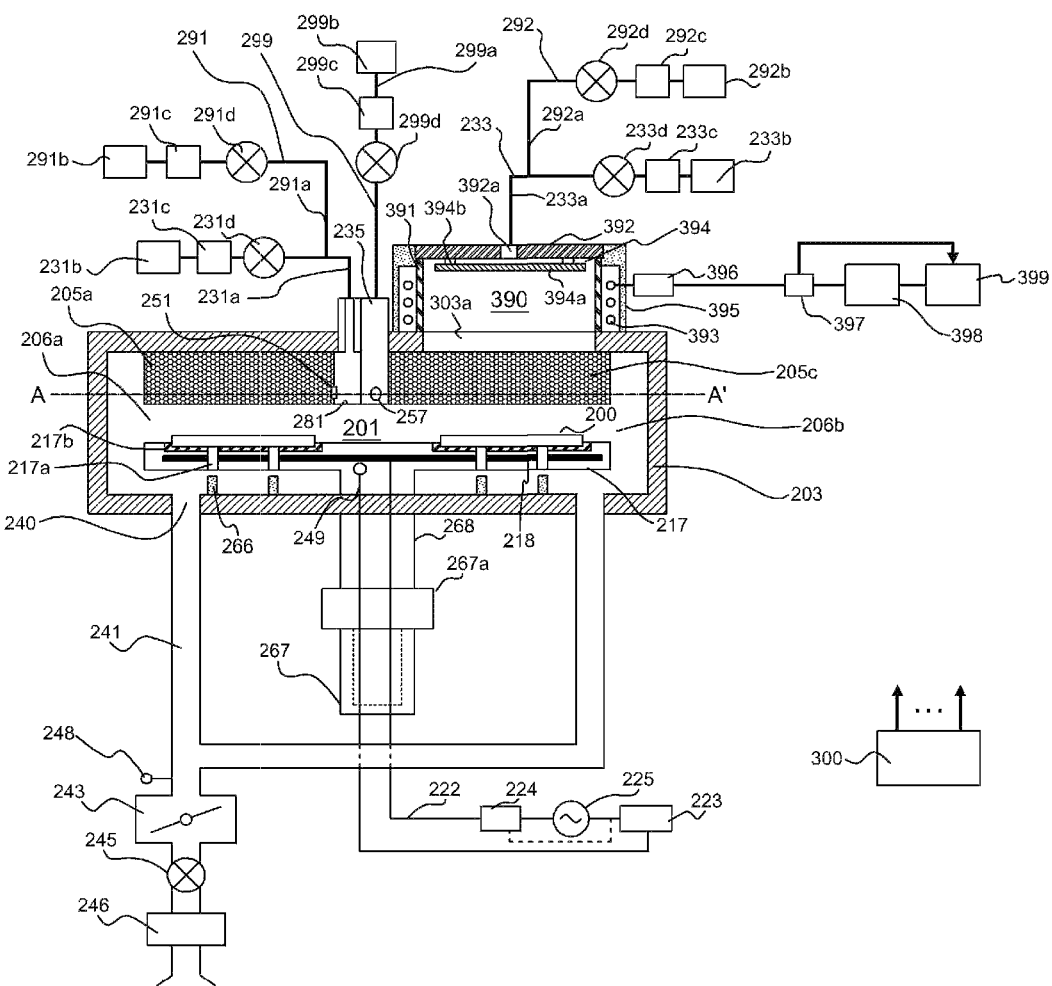
FIG. 12 is a vertical cross-sectional schematic view of a process chamber included in a substrate processing apparatus according to a fourth embodiment of the present invention.

As illustrated in FIG. 12, a communication port 303a having a greater diameter than the substrate [for example, the wafer 200] is provided at a ceiling portion in the second processing region 206b of the reaction container 203. A plasma generating chamber 390 is connected to the communication port 303a. The plasma generating chamber 390 includes a sidewall 391 and a ceiling 392, and is connected to the reactive gas supply system through a reactive gas inlet hole 392a provided at the ceiling 392. The sidewall 391 has a structure of a cylindrical shape and has an outer circumference on which a coil 393 is wound. The sidewall 391 is made of, for example, quartz, and has a greater diameter than the substrate. The sidewall 391 has the same diameter as the communication port 303a. The communication port 303a is disposed at a position in which an outer circumference of the wafer 200 passes through an inside of the communication port 303a.

In the direction of gravity, a gas dispersion structure 394 is provided between the reactive gas inlet hole 392a provided at the ceiling 392 and an upper end of the coil 393. The gas dispersion structure 394 includes a gas dispersion plate 394a and a fixing structure 394b for fixing the plate at the ceiling. The gas dispersion plate 394a is a circular plate having no hole and a member in a diameter direction extends in a direction of the coil 393 such that a gas supplied through the reactive gas inlet hole 392a is guided to the vicinity of the coil 393. The fixing structure 394b includes a plurality of posts and has a structure in which a flow of a gas supplied through the gas inlet hole 392a is not interfered. One end of the fixing structure 394b is fixed to a part of the gas dispersion plate 394a and the other end thereof is fixed to the ceiling 392.

A part forming a circumference of the coil 393, that is, a part adjacent to the sidewall 391 has a curvature of a constant shape. By the constant curvature, a magnetic field generated when a current flows in the coil is uniformized along an inner circumference of the sidewall 391 and thus a density in a circumferential direction of the generated plasma may be uniformized.

A waveform regulation circuit 396, an RF sensor 397, a high frequency power source 398 and a frequency matching unit 399 are connected to the coil 393.

The high frequency power source 398 supplies high frequency power to the coil 393. The RF sensor 397 is provided to an output side of the high frequency power source 398. The RF sensor 397 monitors information on a supplied high frequency traveling wave or a reflected wave. The frequency matching unit 399 controls the high frequency power source 398 such that the reflected wave is minimized based on the information on the reflected wave monitored by the RF sensor 397.

In order to form a standing wave of a predetermined wavelength, a winding diameter, a winding pitch and the number of windings of the coil 393 are set to resonate in a constant wavelength mode. That is, a combined electrical length of the coil 393 and the adjacent waveform regulation circuit 396 is set to a length that corresponds to an integer multiple (once, twice, . . . ) of one wavelength at a predetermined frequency of power supplied from the high frequency power source 398.

Both ends of the coil 393 are electrically grounded, but at least one end of the coil 393 is grounded through a movable tap in order to finely regulate the electrical length of the resonant coil when the device is initially provided or a process condition is changed. The other end of the coil 393 is connected to fixed ground. Also, when the device is initially provided or a process condition is changed, a power supply unit is configured by a movable tap between the grounded both ends of the coil 393 in order to finely regulate an impedance of the coil 393.

The coil 393 is surrounded by a shielding plate 395. The shielding plate 395 blocks an electromagnetic wave generated from the coil 393 and the like. Specifically, the shielding plate 395 is provided to shield a leakage of the electromagnetic wave to the outside of the coil 393 and form a capacitive component necessary for forming a resonant circuit between the coils 393. The shielding plate 395 generally uses a conductive material such as an aluminum alloy, copper or a copper alloy and is formed to have a cylindrical shape.

The RF sensor 397 is provided at an output side of the high frequency power source 398 and monitors a traveling wave towards the coil 393, a reflected wave reflected from the coil 393 and the like. The reflected wave power monitored by the RF sensor 397 is input to the frequency matching unit 399. The frequency matching unit 399 controls a frequency so that the reflected wave is minimized.

The first plasma generating unit according to the present embodiment mainly includes the plasma generating chamber 390, the coil 393, the waveform regulation circuit 396, the RF sensor 397 and the frequency matching unit 399. Also, the high frequency power source 398 may be included in the first plasma generating unit.

(Reactive Gas Supply System)

In the ceiling portion of the reaction container 203, the communication port 303a is provided above the second processing region 206b. The plasma generating chamber 390 to be described below is connected to the communication port 303a. The reactive gas inlet hole 392a is provided at the ceiling 392 of the plasma generating chamber 390. A reactive gas supply system 233 (is also called a reactive gas supply unit) is connected to the reactive gas inlet hole 392a.

A downstream end of the third gas supply pipe 233a is connected to the reactive gas inlet hole 392a. In the third gas supply pipe 233a, in order from an upstream end, the reactive gas supply source 233b, the mass flow controller (MFC) 233c serving as a flow rate controller (flow rate control unit) and the valve 233d serving as an on-off valve are provided.

From the reactive gas supply source 233b, a nitrogen-containing gas serving as the reactive gas is supplied into the second processing region 206b through the MFC 233c, the valve 233d, the plasma generating chamber 390 and the communication port 303a, as the reactive gas.

Also, a downstream end of the inert gas supply pipe 292a is connected to a downstream side from the valve 233d of the third gas supply pipe 233a. In the inert gas supply pipe 292a, in order from an upstream end, the inert gas supply source 292b, the MFC 292c and the valve 292d are provided. Through the inert gas supply pipe 292a, the inert gas is supplied into the third processing region 206c with the MFC 292c, the valve 292d, the third gas supply pipe 233a, the plasma generating chamber 390 and the communication port 303a therebetween.

The reactive gas supply unit mainly includes the third gas supply pipe 233a, the MFC 233c, the valve 233d and the reactive gas inlet hole 392a. Also, the reactive gas supply source 233b may be included in the reactive gas supply system.

As illustrated in FIG. 13, there is no change in the first processing region 206a and the third processing region 206c except that the reactive gas plasma generating unit configured to generate inductively coupled plasma is provided in the second processing region 206b. Also, since the first purge region 207a and the second purge region 207b have no change, the present embodiment (the fourth embodiment) may have the same effects as in the first embodiment.

In the present embodiment, only plasma is changed to inductively coupled plasma. The plasma is used in the process in the second processing region 206b, that is, the process in which the first layer formed on a surface of the substrate [the wafer 200] when the substrate passes through the first processing region 206a reacts with plasma of the reactive gas generated by the reactive gas plasma generating unit when the substrate [the wafer 200] passes through the second processing region 206b to form the second layer.

That is, similar to the first embodiment, in the present embodiment, when the wafer 200 passes through the second processing region 206b, the first layer reacts with plasma of reactive gas (NH3 gas) in the second processing region 206b to form the second layer. In this case, a nitrogen component of active species of NH3 gas is bound to a first element component of the first layer. A hydrogen component of active species of NH3 gas reacts with a chlorine (Cl) component of the first layer, becomes HCl and is desorbed from the first layer. In this manner, a high quality layer (the second layer) containing at least the first element and the second element is formed on the wafer 200.

Also, in the present embodiment, the reactive gas is supplied to the second processing region 206b through the reactive gas inlet hole 392a provided above the plasma generating chamber 390 with the gas dispersion plate 394a therebetween. Also, through an inert gas inlet 299 provided at a center portion of the ceiling portion of the reaction container 203, the inert gas is supplied to the second processing region 206b with the second gas outlet 252 therebetween.

Meanwhile, in the first embodiment to the third embodiment, a direction in which the reactive gas flows over the wafer and a direction of the groove portion for forming a wire of the semiconductor device of the wafer do not match in some cases. In this case, since plasma of the reactive gas may not be uniformly delivered to the vicinity of a bottom surface of the groove portion, a film density of the thin film may decrease. A phenomenon in which the film density of the thin film decreases tends to be significant particularly when the groove portion has a high aspect ratio or when the susceptor has a high rotation speed.

According to the present embodiment, in such a case, plasma of the reactive gas is uniformly supplied to the vicinity of the bottom surface of the groove portion. Therefore, without a high abundance ratio of residues in the thin film due to remaining residues such as some components of molecules of the source gas in the thin film, the high quality thin film may be formed. Also, the above-described effects may also be obtained when a gas other than TiCl4 gas is used as the source gas. Also, the above-described effects may also be obtained when a gas other than NH3 gas is used as the nitrogen-containing gas or when an inert gas other than N2 gas is used as the purge gas.

Other Embodiments of the Present Invention

While the embodiments of the present invention have been specifically described above, the present invention is not limited to the above-described embodiments, but may be variously modified without departing from the scope of the invention.

The above-described embodiments (the first embodiment to the fourth embodiment) have described the case in which the gap is provided between an end of the partition plate 205 in a horizontal direction and the sidewall of the reaction container 203 and a pressure in the process chamber 201 is the same in each of the regions. However, the first processing region 206a, the first purge region 207a, the second processing region 206b, the third processing region 206c and the second purge region 207b may be hermetically divided. Also, the pressure in each of the regions may be different.

Also, the above-described embodiments (the first embodiment to the fourth embodiment) have described the case in which the five wafers 200 are processed by the one process chamber 202. However, the one wafer 200 or more than five wafers 200 may be processed by the one process chamber 202.

Also, the above-described embodiments (the first embodiment to the fourth embodiment) have described the case in which the spare chamber 122 or the spare chamber 123 is configured to have functions of both loading the wafer 200 and unloading the wafer 200. However, one of the spare chamber 122 and the spare chamber 123 may be provided for unloading and the other thereof may be provided for loading. When the spare chamber 122 or the spare chamber 123 is dedicated for loading or unloading, cross contamination may be decreased. When the functions of both loading and unloading are provided, transfer efficiency of the substrate may be increased.

Also, the above-described embodiments (the first embodiment to the fourth embodiment) have described substrate processing in the one process chamber 202, but processing in each of the process chambers may be concurrently performed.

Also, the above-described embodiments (the first embodiment to the fourth embodiment) have described the case in which the four process chambers 202 are similarly configured. However, each of the process chambers may have a different configuration and each of the process chambers may perform a separate process. For example, when the first process chamber and the second process chamber perform different processes, a predetermined process is performed on the wafer 200 by the first process chamber and then a process different from that of the first process chamber may be performed by the second process chamber. Also, when a predetermined process is performed on the substrate by the first process chamber and then a different process is performed by the second process chamber, the spare chamber may be passed through.

Also, the above-described embodiments (the first embodiment to the fourth embodiment) have described the case in which TiCl4 gas is used as the source gas and NH3 gas is used as the reactive gas to form the TiN film on the wafer 200 as a nitride film. However, O2 gas may be used as the reactive gas to form an oxide film. Other nitride films such as TaN and SiN, an oxide film such as HfO, ZrO and SiO and a metal film such as Ru, Ni and W may be formed on the wafer 200. The above-described effects may also be obtained when a gas other than TiCl4 gas is used as the source gas. Also, the above-described effects may also be obtained when a gas other than NH3 gas is used as the nitrogen-containing gas or when an inert gas other than N2 gas is used as the purge gas.

Also, the above-described embodiments (the first embodiment to the fourth embodiment) have described the case in which the electrodes of the plasma generating unit have a rod shape in the third processing region 206c, but the present invention is not limited thereto. The electrodes of the plasma generating unit may be electrodes having a comb shape that faces to each other or electrodes that have a shape other than the comb shape. Also, the electrodes of the plasma generating unit may cover substantially all regions of the processing regions.

Also, the above-described embodiments (the first embodiment to the fourth embodiment) have described the case in which the processing gas is supplied into each of the processing regions and plasma is generated by the plasma generating unit, but the present invention is not limited thereto. A remote plasma method in which plasma is generated outside the reaction container or ozone having a high energy level may be used. Also, in a modification process in the third processing region 206c, the modification process is performed by capacitively coupled plasma generated by the modifying gas plasma generating unit, but the present invention is not limited thereto. For example, other plasma such as inductively coupled plasma rather than capacitively coupled plasma and plasma using a microwave may be used. Also, there is no need to perform the modification process with plasma, and for example, annealing such as lamp heating may be used.

Also, the above-described embodiments (the first embodiment to the fourth embodiment) have described the case in which the inert gas inlet 285 is shared by the first purge region 207a and the second purge region 207b. However, the inert gas inlet may be individually provided.

Also, the above-described embodiments (the first embodiment to the fourth embodiment) have described the case in which each gas is supplied into each of the processing regions from the center of the reaction container 203. However, a nozzle configured to supply a gas may be provided in each of the processing regions.

Also, the above-described embodiments (the first embodiment to the fourth embodiment) have described the case in which the lifting mechanism 268 is used to lift the susceptor 217 such that the wafer 200 moves to a process position or a transfer position. However, the wafer may be moved to the process position or the transfer position by lifting of the wafer lift pin.

Also, the above-described second embodiment has described the case in which the pre-processing gas supply system configured to supply the pre-processing gas into the fourth processing region 206d is provided separately from the modifying gas supply system configured to supply the modifying gas into the third processing region 206c. However, when the pre-processing gas and the modifying gas are the same, the pre-processing gas supply system may share at least a part of the modifying gas supply system.

Also, the above-described second embodiment has described the case in which the pre-processing gas and the modifying gas are the same. However, the pre-processing gas may be a gas other than the modifying gas.

Also, the above-described second embodiments have described the case in which the process chamber 202 of the substrate processing apparatus 10 includes the fourth processing region 206d through which the wafer 200 passes before the second processing region 206b and in which the pre-processing gas is supplied, and the third processing region 206c through which the wafer 200 passes after the second processing region 206b and in which the modifying gas is supplied. However, the process chamber of the substrate processing apparatus may include at least one of the fourth processing region and the third processing region. That is, the process chamber of the substrate processing apparatus may include only the fourth processing region through which the wafer passes before the second processing region and in which the pre-processing gas is supplied.

Also, the above-described embodiments (the first embodiment to the fourth embodiment) have described the case in which the first purge region 207a is provided between the first processing region 206a and the second processing region 206b, and the second purge region 207b is provided between the third processing region 206c and the first processing region 206a. However, a position in which the purge region is provided may be changed arbitrarily. For example, at least one of the first purge region and the second purge region may not be provided. Also, a third purge region may be provided between the second processing region 206b and the third processing region 206c.

Also, the above-described embodiments (the first embodiment to the third embodiment) have described the case in which the processing gas is supplied into each of the processing regions through the gas inlet 280 provided at the center portion of the ceiling portion of the reaction container 203 and the plurality of gas outlets included in each of the plasma generating units. However, the processing gas may be supplied into each of the processing regions through at least any of the gas inlet provided at the center portion of the ceiling portion of the reaction container and the plurality of gas outlets included in each of the plasma generating units.

According to the present invention, it is possible to form a high quality thin film by forming a thin film while remaining residues are suppressed.

Exemplary Embodiments of the Present Invention

Exemplary embodiments of the present invention will be supplementarily described below.

Supplementary Note 1

According to one aspect of the present invention, there is provided a substrate processing apparatus including: a process chamber including a first processing region, a second processing region and a third processing region, and configured to process a substrate in the first processing region, the second processing region and the third processing region; a rotation unit configured to rotate a substrate placement unit supporting the substrate; a process gas supply system configured to supply a source gas, a reactive gas and a modifying gas to the first processing region, the second processing region and the third processing region, respectively; a reactive gas plasma generating unit configured to generate plasma of the reactive gas in the second processing region; a modifying gas plasma generating unit configured to generate plasma of the modifying gas in the third processing region; and a control unit configured to control the rotation unit, the process gas supply system, the reactive gas plasma generating unit and the modifying gas plasma generating unit to pass the substrate through the first processing region, the second processing region and the third processing region in sequence by rotating the substrate placement unit, to form a first layer on the substrate while the substrate passes through the first processing region and a second layer by reacting the first layer with the plasma of the reactive gas while the substrate passes through the second processing region, and to modify the second layer with the plasma of the modifying gas while the substrate passes through the third processing region.

Supplementary Note 2

In the substrate processing apparatus of Supplementary note 1, preferably, the control unit is configured to control the reactive gas plasma generating unit and the modifying gas plasma generating unit in a manner that a plasma power applied to the modifying gas is higher than that applied to the reactive gas.

Supplementary Note 3

In the substrate processing apparatus of Supplementary note 1 or 2, preferably, the process chamber further includes a partitioning structure dividing the process chamber into the first processing region, the second processing region and the third processing region in a manner that the substrate passes through by rotating the substrate placement unit Supplementary Note 4

In the substrate processing apparatus of Supplementary note 3, preferably, the third processing region is adjacent to second processing region with the partitioning structure therebetween.

Supplementary Note 5

In the substrate processing apparatus of Supplementary note 3 or 4, preferably, the process chamber further includes a gap under the partitioning structure where the substrate passes through.

Supplementary Note 6

In the substrate processing apparatus of Supplementary note 1 through 5, preferably, the process chamber further includes: a purge region disposed between the first processing region and the second processing region; and an inert gas supply system configured to supply an inert gas into the purge region.

Supplementary Note 7

In the substrate processing apparatus of Supplementary note 1 through 6, preferably, the control unit is configured to control the rotation unit to pass the substrate through the first processing region, the second processing region and the third processing region in sequence a plurality of times by rotating the substrate placement unit at a predetermined angular velocity.

Supplementary Note 8

In the substrate processing apparatus of Supplementary note 1 through 7, preferably, a plasma excitation frequency of the modifying gas plasma generating unit is different from that of the reactive gas plasma generating unit.

Supplementary Note 9

In the substrate processing apparatus of Supplementary note 1 through 8, preferably, a plasma generating electrode of the modifying gas plasma generating unit has a configuration different from that of the reactive gas plasma generating unit.

Supplementary Note 10

In the substrate processing apparatus of Supplementary note 1 through 9, preferably, the process chamber further includes: a fourth processing region disposed between the first processing region and the second processing region; a pre-processing gas supply system configured to supply a pre-processing gas to the fourth processing region, the pre-processing gas supply system being a part of the process gas supply system; and a pre-processing gas plasma generating unit configured to generate plasma of the pre-processing gas in the fourth processing region, at least a portion of the pre-processing gas plasma generating unit being disposed in the fourth processing region, and the control unit is configured to control the pre-processing gas supply system and the pre-processing gas plasma generating unit to pass the substrate through the first processing region, the fourth processing region, the second processing region and the third processing region in sequence by rotating the substrate placement unit and to form a modified layer by modifying the first layer with the plasma of the pre-processing gas generated by the pre-processing gas plasma generating unit while the substrate passes through the fourth processing region.

Supplementary Note 11

In the substrate processing apparatus of Supplementary note 10, preferably, a plasma excitation frequency of the pre-processing gas plasma generating unit is different from that of the reactive gas plasma generating unit.

Supplementary Note 12

In the substrate processing apparatus of Supplementary note 1 through 11, preferably, the third processing region is larger than the second processing region.

Supplementary Note 13

In the substrate processing apparatus of Supplementary note 1 through 12, preferably, a combined area of the second processing region and the third processing region is larger than the first processing region.

Supplementary Note 14

In the substrate processing apparatus of Supplementary note 1 through 13, preferably, the process gas supply system is configured to supply the source gas, the reactive gas and the modifying gas in a manner that a total amount of the reactive gas and the modifying gas is greater than an amount of the source gas supplied to the substrate, the plasma of the reactive gas and the plasma of the modifying gas being generated in the second processing region and the third processing region, respectively and being radiated to the substrate.

Supplementary Note 15

In the substrate processing apparatus of Supplementary note 1 through 14, preferably, the source gas includes at least one selected from the group consisting of titanium, tantalum, silicon, hafnium, zirconium, ruthenium, nickel and tungsten.

Supplementary Note 16

In the substrate processing apparatus of Supplementary note 1 through 14, preferably, the reactive gas includes at least one selected from the group consisting of $NH_3$ gas, $N_2$ gas, $H_2$ gas and $O_2$ gas.

Supplementary Note 17

In the substrate processing apparatus of Supplementary note 1 through 14, preferably, the modifying gas includes at least one selected from the group consisting of $H_2$ gas, $N_2$ gas, $O_2$ gas, He gas and Ar gas.

Supplementary Note 18

According to another aspect of the present invention, there is provided a substrate processing apparatus including: a process chamber including a first processing region, a second processing region and a third processing region, and configured to process a substrate in the first processing region, the second processing region and the third processing region; a rotation unit configured to rotate a substrate placement unit supporting the substrate; a process gas supply system configured to supply a source gas, a reactive gas and a pre-processing gas to the first processing region, the second processing region and the third processing region, respectively; a reactive gas plasma generating unit configured to generate plasma of the reactive gas in the second processing region; a pre-processing gas plasma generating unit configured to generate plasma of the pre-processing gas in the third processing region; and a control unit configured to control the rotation unit, the process gas supply system, the reactive gas plasma generating unit and the pre-processing gas plasma generating unit to pass the substrate through the first processing region, the third processing region and the second processing region in sequence by rotating the substrate placement unit and to form: a first layer on the substrate while the substrate passes through the first processing region; a modified layer by modifying the first layer with the plasma of the pre-processing gas while the substrate passes through the third processing region; and a second layer by reacting the modified layer with the plasma of the reactive gas while the substrate passes through the second processing region.

Supplementary Note 19

According to another aspect of the present invention, there is provided a method of manufacturing a semiconductor device including: placing a substrate on a substrate placement unit capable of rotating in a process chamber; supplying a source gas into a first processing region of the process chamber; generating plasma of a reactive gas in a second processing region of the process chamber; generating plasma of a modifying gas in a third processing region of the process chamber; rotating the substrate placement unit to pass the substrate through the first processing region, the second processing region and the third processing region; forming a first layer on the substrate while the substrate passes through the first processing region; forming a second layer by reacting the first layer with the plasma of the reactive gas while the substrate passes through the second processing region; and modifying the second layer with the plasma of the modifying gas while the substrate passes through the third processing region.

Supplementary Note 20

According to still another aspect of the present invention, there is provided a program or a non-transitory computer-readable recording medium storing a program for causing a computer to perform: placing a substrate on a substrate placement unit capable of rotating in a process chamber; supplying a source gas into a first processing region of the process chamber; generating plasma of a reactive gas in a second processing region of the process chamber; generating plasma of a modifying gas in a third processing region of the process chamber; rotating the substrate placement unit to pass the substrate through the first processing region, the second processing region and the third processing region; forming a first layer on the substrate while the substrate passes through the first processing region; forming a second layer by reacting the first layer with the plasma of the reactive gas while the substrate passes through the second processing region; and modifying the second layer with the plasma of the modifying gas while the substrate passes through the third processing region.

What is claimed is:

1. A substrate processing apparatus comprising:
   a process chamber including a first processing region, a second processing region and a third processing region, and configured to process a substrate in the first processing region, the second processing region and the third processing region;

a rotation unit configured to rotate a substrate placement unit supporting the substrate;

a process gas supply system configured to supply a source gas containing a first element and a halogen element, a reactive gas containing a second element and a modifying gas free of the second element to the first processing region, the second processing region and the third processing region, respectively;

a reactive gas plasma generating unit configured to generate plasma of the reactive gas in the second processing region;

a modifying gas plasma generating unit configured to generate plasma of the modifying gas in the third processing region; and a control unit configured to control the rotation unit, the process gas supply system, the reactive gas plasma generating unit and the modifying gas plasma generating unit to pass the substrate through the first processing region, the second processing region and the third processing region in sequence by rotating the substrate placement unit, to form a first layer containing the first element on the substrate while the substrate passes through the first processing region and a second layer containing the first element and the second element by reacting the first layer with the plasma of the reactive gas and desorbing the halogen element remaining in the first layer while the substrate passes through the second processing region, and to modify the second layer by reacting the second layer with the plasma of the modifying gas and desorbing the halogen element remaining in the second layer while the substrate passes through the third processing region.

2. The substrate processing apparatus of claim 1, wherein the third processing region is larger than the second processing region.

3. The substrate processing apparatus of claim 1, wherein the process chamber further comprises a partitioning structure dividing the process chamber into the first processing region, the second processing region and the third processing region in a manner that the substrate passes through by rotating the substrate placement unit.

4. The substrate processing apparatus of claim 3, wherein the third processing region is adjacent to second processing region with the partitioning structure therebetween.

5. The substrate processing apparatus of claim 3, wherein the process chamber further comprises a gap under the partitioning structure where the substrate passes through.

6. The substrate processing apparatus of claim 1, wherein the process chamber further comprises: a purge region disposed between the first processing region and the second processing region; and an inert gas supply system configured to supply an inert gas into the purge region.

7. The substrate processing apparatus of claim 1, wherein the control unit is configured to control the rotation unit, the process gas supply system, the reactive gas plasma generating unit and the modifying gas plasma generating unit to pass the substrate through the first processing region, the second processing region and the third processing region in sequence a plurality of times by rotating the substrate placement unit at a predetermined angular velocity to form the second layer on the substrate.

8. The substrate processing apparatus of claim 1, wherein a plasma generating electrode of the modifying gas plasma generating unit has a configuration different from that of the reactive gas plasma generating unit.

9. The substrate processing apparatus of claim 1, wherein the first element is selected from the group consisting of titanium, tantalum, silicon, hafnium, zirconium, ruthenium, nickel and tungsten.

10. The substrate processing apparatus of claim 1, wherein the reactive gas comprises at least one selected from the group consisting of $NH_3$ gas, $N_2$ gas, $H_2$ gas and $O_2$ gas.

11. The substrate processing apparatus of claim 1, wherein the modifying gas comprises at least one selected from the group consisting of $H_2$ gas, $N_2$ gas, $O_2$ gas, He gas and Ar gas.

12. The substrate processing apparatus of claim 1, wherein the second element comprises nitrogen atoms, and the halogen element comprises chlorine atoms.

13. The substrate processing apparatus of claim 1, wherein the reactive gas further contains a reductive element reducing the second element, and the control unit is further configured to control the rotation unit, the process gas supply system, the reactive gas plasma generating unit and the modifying gas plasma generating unit to form the second layer by reacting the second element in an active species of the reactive gas with the first element in the first layer and desorbing the halogen element remaining in the first layer with the reductive element in the active species of the reactive gas while the substrate passes through the second processing region.

14. The substrate processing apparatus of claim 1, wherein the reactive gas comprises a nitride hydrogen-based gas, and the control unit is further configured to control the rotation unit, the process gas supply system, the reactive gas plasma generating unit and the modifying gas plasma generating unit to form the second layer by reacting nitrogen in an active species of the nitride hydrogen-based gas with the first element in the first layer and desorbing the halogen element remaining in the first layer with hydrogen in the active species of the nitride hydrogen-based gas while the substrate passes through the second processing region.

15. The substrate processing apparatus of claim 1, wherein a power applied to the modifying gas plasma generating unit to generate the plasma of the modifying gas in the third processing region is higher than a power applied to the reactive gas plasma generating unit to generate the plasma of the reactive gas in the second processing region.

16. The substrate processing apparatus of claim 1, wherein a plasma excitation frequency of the modifying gas plasma generating unit is higher than that of the reactive gas plasma generating unit.

17. A method of manufacturing a semiconductor device, comprising:

placing a substrate on a substrate placement unit capable of rotating in a process chamber;

supplying a source gas containing a first element and a halogen element into a first processing region of the process chamber;

generating plasma of a reactive gas containing a second element in a second processing region of the process chamber;

generating plasma of a modifying gas free of the second element in a third processing region of the process chamber;

rotating the substrate placement unit to pass the substrate through the first processing region, the second processing region and the third processing region;

forming a first layer containing the first element on the substrate while the substrate passes through the first processing region;

forming a second layer containing the first element and the second element by reacting the first layer with the plasma of the reactive gas and desorbing the halogen element remaining in the first layer while the substrate passes through the second processing region; and modifying the second layer by reacting the second layer with the plasma of the modifying gas and desorbing the halogen element remaining in the second layer while the substrate passes through the third processing region.

18. A non-transitory computer-readable recording medium storing a program causing a computer to perform:

placing a substrate on a substrate placement unit capable of rotating in a process chamber;

supplying a source gas containing a first element and a halogen element into a first processing region of the process chamber;

generating plasma of a reactive gas containing a second element in a second processing region of the process chamber;

generating plasma of a modifying gas free of the second element in a third processing region of the process chamber;

rotating the substrate placement unit to pass the substrate through the first processing region, the second processing region and the third processing region;

forming a first layer containing the first element on the substrate while the substrate passes through the first processing region;

forming a second layer containing the first element and the second element by reacting the first layer with the plasma of the reactive gas and desorbing the halogen element remaining in the first layer while the substrate passes through the second processing region; and modifying the second layer by reacting the second layer with the plasma of the modifying gas and desorbing the halogen element remaining in the second layer while the substrate passes through the third processing region.

* * * * *